(12) United States Patent
Oh et al.

(10) Patent No.: US 8,276,050 B2
(45) Date of Patent: Sep. 25, 2012

(54) METHOD AND APPARATUS OF ENCODING AND DECODING DATA USING LOW DENSITY PARITY CHECK CODE IN A WIRELESS COMMUNICATION SYSTEM

(75) Inventors: Min Seok Oh, Seoul (KR); Ki Hyoung Cho, Anyang-si (KR); Kyu Hyuk Chung, Seoul (KR)

(73) Assignee: LG Electronics Inc., Seoul (KR)

( * ) Notice: Subject to any disclaimer, the term of this patent is extended or adjusted under 35 U.S.C. 154(b) by 587 days.

(21) Appl. No.: 12/414,593

(22) Filed: Mar. 30, 2009

(65) Prior Publication Data

US 2009/0199068 A1    Aug. 6, 2009

Related U.S. Application Data

(63) Continuation of application No. 11/166,476, filed on Jun. 23, 2005, now Pat. No. 7,581,157.

(30) Foreign Application Priority Data

| | | |
|---|---|---|
| Jun. 24, 2004 | (KR) | 10-2004-0047898 |
| Jun. 25, 2004 | (KR) | 10-2004-0048454 |
| Oct. 25, 2004 | (KR) | 10-2004-0085512 |
| Oct. 29, 2004 | (KR) | 10-2004-0087361 |
| Nov. 1, 2004 | (KR) | 10-2004-0087938 |
| Nov. 3, 2004 | (KR) | 10-2004-0088807 |
| Dec. 21, 2004 | (KR) | 10-2004-0109624 |
| Dec. 22, 2004 | (KR) | 10-2004-0110678 |
| Dec. 23, 2004 | (KR) | 10-2004-0111525 |
| Dec. 30, 2004 | (KR) | 10-2004-0117136 |
| Jan. 3, 2005 | (KR) | 10-2005-0000046 |
| Jan. 3, 2005 | (KR) | 10-2005-0000244 |
| Jan. 13, 2005 | (KR) | 10-2005-0003296 |

(51) Int. Cl. *H03M 13/00* (2006.01)
(52) U.S. Cl. ...................................................... 714/781
(58) Field of Classification Search .......... 714/779–786, 714/790–797, 798, 799, 804, 820, 821
See application file for complete search history.

(56) References Cited

U.S. PATENT DOCUMENTS 6,567,465 B2 * 5/2003 Goldstein et al. ............. 375/222
6,633,856 B2 * 10/2003 Richardson et al. ............ 706/15

(Continued)

FOREIGN PATENT DOCUMENTS

CN        1499731       5/2004

(Continued)

OTHER PUBLICATIONS

Classon, B., et al., "LDPC Coding for OFDMA PHY," IEEE 802.16 Broadband Wireless Access Working Group, IEEE C802.16e-05/066r3, Jan. 27, 2005.

(Continued)

*Primary Examiner* — Nadeem Iqbal
(74) *Attorney, Agent, or Firm* — Lee, Hong, Degerman, Kang & Waimey

(57) ABSTRACT

A method of encoding data using low density parity check (LDPC) code defined by a m×n parity check matrix is disclosed. More specifically, the method includes encoding input source data using the parity check matrix, wherein the parity check matrix comprises a plurality of z×z sub-matrices of which row weights and column weights are '0' or '1'.

15 Claims, 20 Drawing Sheets

U.S. PATENT DOCUMENTS

| | | | |
|---|---|---|---|
| 6,718,508 | B2 | 4/2004 | Lodge et al. |
| 6,757,122 | B1 | 6/2004 | Kuznetsov et al. |
| 6,829,308 | B2 | 12/2004 | Eroz et al. |
| 6,833,856 | B2* | 12/2004 | Maeda ............... 347/248 |
| 6,957,375 | B2* | 10/2005 | Richardson ........... 714/752 |
| 6,961,888 | B2* | 11/2005 | Jin et al. ............. 714/752 |
| 7,120,856 | B2* | 10/2006 | Zhang et al. .......... 714/801 |
| 7,133,853 | B2 | 11/2006 | Richardson et al. |
| 7,143,333 | B2 | 11/2006 | Blankenship et al. |
| 7,162,684 | B2 | 1/2007 | Hocevar |
| 7,178,082 | B2* | 2/2007 | Yu et al. ............. 714/752 |
| 7,188,281 | B2* | 3/2007 | Kim et al. ............ 714/700 |
| 7,188,297 | B2 | 3/2007 | Blankenship et al. |
| 7,260,763 | B2 | 8/2007 | Sukhobok et al. |
| 7,302,629 | B2 | 11/2007 | Kyung et al. |
| 7,313,752 | B2 | 12/2007 | Kyung et al. |
| 7,343,548 | B2 | 3/2008 | Blankenship et al. |
| 7,373,581 | B2* | 5/2008 | Okamura et al. ....... 714/752 |
| 7,415,659 | B2 | 8/2008 | Banister et al. |
| 7,581,157 | B2 | 8/2009 | Oh et al. |
| 2003/0033570 | A1 | 2/2003 | Khannanov et al. |
| 2004/0034828 | A1 | 2/2004 | Hocevar |
| 2004/0057575 | A1 | 3/2004 | Zhang et al. |
| 2004/0148560 | A1 | 7/2004 | Hocevar |
| 2004/0194007 | A1 | 9/2004 | Hocevar |
| 2008/0077843 | A1 | 3/2008 | Cho et al. |

FOREIGN PATENT DOCUMENTS

| | | |
|---|---|---|
| EP | 1622276 | 2/2006 |
| WO | 2004006442 | 1/2004 |
| WO | 2004/019268 | 3/2004 |
| WO | 2004047019 | 6/2004 |
| WO | 2004107585 | 12/2004 |

OTHER PUBLICATIONS

Classon, B., et al., "LDPC Coding for OFDMA PHY", IEEE 802.16 Broadband Wireless Access Working Group, IEEE C802.16e-04/278r1, Aug. 17, 2004.

Ire Transactions on Information Theory, Jan. 1962; R. G. Gallager: "Low-Density Parity-Check Codes" p. 21-28.

Tong Zhang; Parhi, K. K.; Joint code and decoder design for implementation-oriented (3, k)-regular LDPC codes; Conference Record of the Thirty-Fifth Asilomar Conference on Signals, Systems and Computers, vol. 2, Nov. 4-7, 2001 pp. 1232-1236.

Tong Zhang; Parhi, K. K.; VLSI implementation-orientation-oriented (3, k)-regular low-density parity check codes; IEEE Workshop on Signal Processing Systems; Sep. 26-28, 2001 pp. 25-36.

Tong Zhang; Parhi, K. K.; A 54 Mbps (3,6)-regular FPGA LDPC decoder; IEEE Workshop on Signal Processing Systems; Oct. 16-18, 2002 pp. 127-132.

Oh et al., "Informative: LDPC parallel processing in IEEE802.16e," IEEE 802.16 Broadband Wireless Access Working Group, IEEE C802.16e-06/168, Mar. 2005.

Classon et al., "LDPC coding for OFDMA PHY," IEEE 802.16 Broadband Wireless Access Working Group, IEEE C802.16e-05/006, Jan. 2005, XP-002509951.

Classon et al., "LDPC coding for OFDMA PHY," IEEE 802.16 Broadband Wireless Access Working Group, IEEE C802.16e-04/372, Aug. 2004, XP-002593119.

Yazdani, M.R., "On Construction of Rate-Compatible Low-Density Parity-Check Codes", IEEE Communications Letters, vol. 8, No. 3, Mar. 2004.

Classon, B., et al., "LDPC Coding for OFDMA PHY", IEEE 802.16 Broadband Wireless Access Working Group, IEEE C802.16e-04/374, Aug. 24, 2004.

Joo, P., et al., "LDPC Coding for OFDMA PHY", IEEE 802.16 Broadband Wireless Access Working Group, IEEE C802.16d-04/86r1, XP-002438609, May 1, 2004.

F. Guilloud, "Architecture generique de decodeur de codes LDPC," These presentee pour obtenir le grade de docteur de l'Ecole nationale superieure des telecommunications, Jul. 2004, XP-002370625.

E. Shasha et al., "Multi-Rate LDPC code for OFDMA PHY," IEEE 802.16 Broadband Wireless Access Working Group, IEEE C802.16e-04/185, Jun. 2004, XP-002334837.

Classon, et al., "LDPC coding for OFDMA PHY", IEEE C802.16e-04/278r1, Aug. 2004.

Classon, et al., "LDPC coding for OFDMA PHY", IEEE C802.16E-04/374, Aug. 2004.

Classon, et al., "LDPC coding for OFDMA PHY", IEEE C802.16E-05/0066r3, Jan. 2005.

Xu, et al., "High Girth LDPC Coding for OFDMA PHY", IEEE C802.16e-05/031r1, Jan. 2005.

Oh, et al., "LDPC Coding for OFDMA PHY", IEEE C802.16e-04/487r3, Nov. 2004.

Index of /tge/contrib, "C802.16e-05_66r3.pdf", pp. 1 and 40.

IEEE 802.16e Task Group (Mobile WirelessMAN®), pp. 1, 4, 31-34.

B. Kiernan, "IEEE 802.16 TGe Session #35 Meeting Minutes", IEEE 802.16 Broadband Wireless Access Working Group, IEEE 802.16e-05/003, Jan. 2005.

G. Even et al., "A dual precision IEEE floating-point multiplier", Integration, The VLSI Journal, vol. 29, No. 2, Sep. 2000, pp. 167-180, XP-004237637.

The Math Forum @ Drexel: Teaching Rounding Rules, Aug. 27, 2003.

* cited by examiner

FIG. 2

$$H = \begin{pmatrix} 1 & 0 & 0 & 1 & | & 0 & 1 & 0 & 1 \\ 0 & 1 & 1 & 0 & | & 1 & 0 & 1 & 0 \\ 1 & 0 & 1 & 0 & | & 0 & 1 & 0 & 0 \\ 0 & 0 & 0 & 1 & | & 1 & 0 & 1 & 0 \end{pmatrix}$$

$$\underbrace{\phantom{1\ 0\ 0\ 1}}_{H_d} \quad \underbrace{\phantom{0\ 1\ 0\ 1}}_{H_p}$$

| (1,1) Sub-matrix | (1,2) Sub-matrix | (1,3) Sub-matrix | (1,4) Sub-matrix |
|---|---|---|---|
| (2,1) Sub-matrix | (2,2) Sub-matrix | (2,3) Sub-matrix | (2,4) Sub-matrix |
| (3,1) Sub-matrix | (3,2) Sub-matrix | (3,3) Sub-matrix | (3,4) Sub-matrix |
| (4,1) Sub-matrix | (4,2) Sub-matrix | (4,3) Sub-matrix | (4,4) Sub-matrix |

FIG. 5

| 1 | 0 | 1 | 1 | 1 |
|---|---|---|---|---|
| 0 | 1 | 1 | 1 | 1 |
| 1 | 1 | 1 | 1 | 0 |
| 1 | 1 | 0 | 1 | 1 |
| 1 | 1 | 1 | 0 | 1 | dual-diagonal $H_p$ $H_d$ | $H_p$ $H$

FIG. 7

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix}$$

FIG. 8

|     |     |     |     |     |     |     |     |     |     |     |     |     |     |     |     |     |     |     |     |     |     |     |     |     |
| --- | --- | --- | --- | --- | --- | --- | --- | --- | --- | --- | --- | --- | --- | --- | --- | --- | --- | --- | --- | --- | --- | --- | --- | --- |
| -1  | 0   | 2   | 3   | -1  | 6   | -1  | -1  | 1   | 0   | -1  | 4   | 8   | -1  | -1  | 0   | 0   | 0   | -1  | -1  | -1  | | | | |
| 7   | -1  | -1  | 4   | 9   | -1  | 7   | 8   | -1  | 5   | 6   | 3   | -1  | -1  | 9   | -1  | 0   | 0   | -1  | -1  | -1  | | | | |
| 8   | -1  | 5   | -1  | 6   | 2   | 4   | 0   | -1  | -1  | 1   | -1  | 5   | 7   | -1  | -1  | -1  | 0   | 0   | -1  | -1  | | | | |
| -1  | 3   | -1  | 2   | 1   | 5   | -1  | -1  | 11  | 3   | -1  | 11  | -1  | 10  | 2   | 0   | -1  | -1  | 0   | 0   | -1  | | | | |
| 9   | -1  | 5   | 4   | -1  | -1  | 11  | 6   | 0   | -1  | 4   | -1  | 1   | -1  | 2   | 0   | -1  | -1  | -1  | 0   | 0   | | | | |

$$\begin{bmatrix}
-1 & 20 & -1 & 75 & -1 & -1 & -1 & -1 & 70 & -1 & 18 & -1 & 1 & 0 & -1 & -1 & -1 & -1 & -1 & -1 & -1 & -1 & -1 & -1 \\
90 & -1 & -1 & -1 & 50 & -1 & -1 & 63 & -1 & -1 & -1 & 53 & -1 & 0 & 0 & -1 & -1 & -1 & -1 & -1 & -1 & -1 & -1 & -1 \\
-1 & -1 & 28 & -1 & -1 & 69 & 52 & -1 & -1 & 23 & -1 & -1 & -1 & -1 & 0 & 0 & -1 & -1 & -1 & -1 & -1 & -1 & -1 & -1 \\
-1 & -1 & 78 & -1 & 1 & 11 & -1 & -1 & 5 & -1 & -1 & -1 & 85 & -1 & -1 & -1 & 0 & 0 & -1 & -1 & -1 & -1 & -1 & -1 \\
72 & -1 & -1 & 36 & -1 & -1 & -1 & -1 & 47 & 45 & -1 & -1 & -1 & -1 & -1 & -1 & 0 & 0 & -1 & -1 & -1 & -1 & -1 & -1 \\
-1 & 8 & -1 & -1 & -1 & 87 & 45 & -1 & -1 & -1 & 91 & -1 & -1 & -1 & -1 & -1 & -1 & 0 & 0 & -1 & -1 & -1 & -1 & -1 \\
-1 & -1 & 67 & 39 & -1 & -1 & -1 & 83 & -1 & -1 & -1 & 58 & 7 & -1 & -1 & -1 & -1 & -1 & 0 & 0 & -1 & -1 & -1 & -1 \\
46 & -1 & -1 & -1 & 35 & -1 & 35 & -1 & -1 & -1 & 22 & -1 & -1 & -1 & -1 & -1 & -1 & -1 & -1 & 0 & 0 & -1 & -1 & -1 \\
-1 & 40 & -1 & -1 & -1 & 63 & -1 & -1 & 32 & 79 & -1 & -1 & -1 & -1 & -1 & -1 & -1 & -1 & -1 & -1 & 0 & 0 & -1 & -1 \\
-1 & 67 & -1 & -1 & -1 & 69 & -1 & 30 & -1 & -1 & -1 & 32 & -1 & -1 & -1 & -1 & -1 & -1 & -1 & -1 & -1 & 0 & 0 & -1 \\
-1 & -1 & -1 & 63 & 9 & -1 & -1 & -1 & 92 & -1 & 62 & -1 & -1 & -1 & -1 & -1 & -1 & -1 & -1 & -1 & -1 & -1 & 0 & 0 \\
34 & -1 & 47 & -1 & -1 & -1 & 43 & -1 & -1 & 31 & -1 & -1 & 0 & -1 & -1 & -1 & -1 & -1 & -1 & -1 & -1 & -1 & -1 & 0
\end{bmatrix}$$

FIG. 16

$$\begin{bmatrix}
1 & -1 & 4 & -1 & -1 & 3 & 7 & -1 & -1 & 17 & -1 & 46 & 21 & -1 & -1 & 65 & 0 & 0 & -1 & -1 & -1 & -1 & -1 & -1 \\
-1 & 19 & -1 & 90 & 86 & -1 & -1 & 49 & 9 & -1 & 91 & -1 & -1 & 32 & 76 & -1 & -1 & 0 & 0 & -1 & -1 & -1 & -1 & -1 \\
-1 & 16 & -1 & 24 & 26 & -1 & -1 & 0 & -1 & 28 & -1 & 11 & -1 & 52 & -1 & 94 & -1 & -1 & 0 & 0 & -1 & -1 & -1 & -1 \\
39 & -1 & 61 & -1 & -1 & 92 & 53 & -1 & 58 & -1 & 38 & -1 & 88 & -1 & 66 & -1 & -1 & -1 & -1 & 0 & 0 & -1 & -1 & -1 \\
14 & -1 & -1 & 75 & 60 & -1 & -1 & 67 & -1 & 89 & -1 & 33 & -1 & 40 & -1 & 35 & 0 & -1 & -1 & -1 & 0 & 0 & -1 & -1 \\
-1 & 31 & 78 & -1 & -1 & 36 & 30 & -1 & 54 & -1 & 64 & -1 & 48 & -1 & 57 & -1 & -1 & -1 & -1 & -1 & -1 & 0 & 0 & -1 \\
-1 & 42 & -1 & 93 & -1 & -1 & 77 & 74 & -1 & -1 & 68 & -1 & 41 & 23 & -1 & -1 & -1 & -1 & -1 & -1 & -1 & -1 & 0 & 0 \\
34 & -1 & 84 & -1 & 82 & 6 & -1 & -1 & 72 & 5 & -1 & 87 & -1 & -1 & 15 & 37 & 0 & -1 & -1 & -1 & -1 & -1 & -1 & 0
\end{bmatrix}$$

FIG. 17

$$\begin{bmatrix}
14 & 42 & 84 & 38 & 81 & 78 & 41 & 95 & -1 & -1 & 46 & -1 & -1 & -1 & 74 & 68 & 23 & 0 & 95 & 0 & -1 & -1 & -1 & -1 \\
37 & 12 & -1 & -1 & 35 & -1 & 58 & 6 & 0 & 90 & -1 & 3 & 10 & 67 & 10 & -1 & -1 & 57 & -1 & 0 & 0 & -1 & -1 & -1 \\
31 & -1 & 88 & 11 & -1 & 66 & -1 & -1 & -1 & 49 & 5 & -1 & 38 & 45 & 53 & 10 & 44 & 92 & -1 & -1 & 0 & 0 & -1 & -1 \\
62 & 30 & 45 & 75 & 2 & 73 & 65 & 60 & 85 & 28 & 27 & 46 & -1 & -1 & -1 & -1 & -1 & -1 & 0 & -1 & -1 & 0 & 0 & -1 \\
-1 & 17 & -1 & -1 & 50 & -1 & -1 & -1 & 45 & -1 & 33 & 79 & 5 & 23 & 72 & 92 & 54 & 45 & -1 & -1 & -1 & -1 & 0 & 0 \\
-1 & -1 & 51 & 25 & -1 & 35 & 55 & 37 & 5 & 56 & -1 & 87 & 22 & 88 & -1 & 47 & 41 & -1 & 95 & -1 & -1 & -1 & -1 & 0
\end{bmatrix}$$

$$\begin{bmatrix} 73 & -1 & 79 & -1 & -1 & 79 & 29 & -1 & 6 & -1 & 2 & -1 & 73 & -1 & -1 & 55 & 95 & 0 & -1 & -1 & -1 & -1 & -1 & -1 \\ -1 & 3 & -1 & 43 & 32 & -1 & -1 & 89 & -1 & 28 & -1 & 79 & -1 & 85 & 34 & -1 & -1 & 0 & 0 & -1 & -1 & -1 & -1 & -1 \\ 10 & -1 & 66 & -1 & -1 & 91 & 26 & -1 & -1 & 47 & 44 & -1 & 43 & -1 & -1 & 11 & -1 & -1 & 0 & 0 & -1 & -1 & -1 & -1 \\ -1 & 44 & -1 & 28 & 53 & -1 & -1 & 68 & 32 & -1 & -1 & 83 & -1 & 42 & 69 & -1 & -1 & -1 & -1 & 0 & 0 & -1 & -1 & -1 \\ -1 & 9 & -1 & 59 & 2 & -1 & 22 & -1 & -1 & 7 & 20 & -1 & -1 & 22 & 84 & -1 & 0 & -1 & -1 & -1 & 0 & 0 & -1 & -1 \\ 63 & -1 & 57 & -1 & -1 & 14 & -1 & 93 & 12 & -1 & -1 & 28 & 17 & -1 & -1 & 22 & -1 & -1 & -1 & -1 & -1 & 0 & 0 & -1 \\ 0 & 83 & -1 & 41 & -1 & 59 & -1 & -1 & 20 & -1 & 58 & -1 & 40 & -1 & 94 & -1 & -1 & -1 & -1 & -1 & -1 & -1 & 0 & 0 \\ -1 & -1 & 23 & -1 & 54 & -1 & 37 & 1 & -1 & 12 & -1 & 50 & -1 & 87 & -1 & 11 & 95 & -1 & -1 & -1 & -1 & -1 & -1 & 0 \end{bmatrix}$$

FIG. 22

$$\begin{bmatrix} 16 & 41 & 85 & 39 & 81 & 78 & 43 & 93 & -1 & -1 & 45 & -1 & -1 & -1 & 74 & 69 & 20 & 0 & 95 & 0 & -1 & -1 & -1 & -1 \\ 1 & 13 & -1 & -1 & 34 & -1 & 56 & 7 & 2 & 90 & -1 & 2 & 67 & 64 & 9 & -1 & -1 & 57 & -1 & 0 & 0 & -1 & -1 & -1 \\ 29 & -1 & 90 & 10 & -1 & 65 & -1 & -1 & -1 & 49 & 5 & -1 & 36 & 44 & 54 & 11 & 44 & 93 & -1 & -1 & 0 & 0 & -1 & -1 \\ 61 & 25 & 44 & 72 & 2 & 74 & 65 & 61 & 85 & 29 & 24 & 45 & -1 & -1 & -1 & -1 & -1 & -1 & 0 & -1 & -1 & 0 & 0 & -1 \\ -1 & 15 & -1 & -1 & 51 & -1 & -1 & -1 & 27 & -1 & 34 & 74 & 5 & 20 & 72 & 95 & 55 & 44 & -1 & -1 & -1 & -1 & 0 & 0 \\ -1 & -1 & 49 & 25 & -1 & 33 & 53 & 40 & 4 & 54 & -1 & 18 & 20 & 89 & -1 & 47 & 42 & -1 & 95 & -1 & -1 & -1 & -1 & 0 \end{bmatrix}$$

FIG. 23

$$\begin{bmatrix} 52 & 37 & -1 & 77 & 84 & -1 & 28 & -1 & 86 & -1 & -1 & 65 & -1 & 83 & -1 & 53 & 48 & 24 & 95 & 0 & -1 & -1 & -1 & -1 \\ -1 & -1 & 33 & -1 & 71 & 85 & 94 & 17 & 59 & 81 & 61 & 89 & 46 & 5 & -1 & 15 & 84 & -1 & -1 & 0 & 0 & -1 & -1 & -1 \\ 65 & 87 & -1 & 64 & 53 & -1 & -1 & 25 & -1 & 28 & 16 & -1 & 22 & 19 & 47 & 77 & -1 & 0 & -1 & -1 & 0 & 0 & -1 & -1 \\ 72 & 13 & 3 & 36 & -1 & 24 & -1 & -1 & 37 & 77 & 72 & -1 & 33 & -1 & 51 & -1 & 91 & -1 & 0 & -1 & -1 & 0 & 0 & -1 \\ -1 & -1 & 66 & 88 & 15 & 53 & 75 & 10 & 72 & 67 & 23 & 41 & -1 & -1 & 91 & -1 & -1 & 89 & -1 & -1 & -1 & -1 & 0 & 0 \\ 46 & 0 & 24 & -1 & -1 & 33 & 78 & 74 & -1 & -1 & -1 & 88 & 14 & 22 & 64 & 38 & 27 & 37 & 95 & -1 & -1 & -1 & -1 & 0 \end{bmatrix}$$

FIG. 24

$$\begin{bmatrix} -1 & 86 & 37 & -1 & 59 & -1 & -1 & 40 & -1 & 79 & 62 & -1 & -1 & 19 & -1 & 43 & 95 & 0 & -1 & -1 & -1 & -1 & -1 & -1 \\ -1 & 31 & -1 & -1 & 20 & -1 & -1 & 61 & -1 & 90 & 13 & -1 & -1 & 92 & -1 & 28 & -1 & 0 & 0 & -1 & -1 & -1 & -1 & -1 \\ -1 & -1 & -1 & 66 & 1 & 49 & -1 & 74 & -1 & 78 & -1 & -1 & -1 & 37 & -1 & 50 & -1 & -1 & 0 & 0 & -1 & -1 & -1 & -1 \\ -1 & -1 & -1 & -1 & 56 & 31 & -1 & 26 & -1 & 3 & -1 & -1 & 25 & 64 & -1 & 19 & -1 & -1 & -1 & 0 & 0 & -1 & -1 & -1 \\ 64 & -1 & -1 & 77 & -1 & 69 & 76 & -1 & 85 & -1 & -1 & 72 & 86 & -1 & 2 & -1 & -1 & -1 & -1 & -1 & 0 & 0 & -1 & -1 \\ 46 & -1 & 79 & -1 & -1 & -1 & 87 & -1 & 37 & -1 & -1 & 61 & 47 & -1 & 42 & -1 & 0 & -1 & -1 & -1 & -1 & 0 & 0 & -1 \\ 75 & 79 & 18 & -1 & -1 & -1 & 58 & -1 & 57 & -1 & 29 & 72 & -1 & -1 & 86 & -1 & -1 & -1 & -1 & -1 & -1 & -1 & 0 & 0 \\ 10 & 52 & 66 & 73 & -1 & -1 & 43 & -1 & 66 & -1 & 23 & 2 & -1 & -1 & 50 & -1 & 95 & -1 & -1 & -1 & -1 & -1 & -1 & 0 \end{bmatrix}$$

FIG. 25

$$\begin{bmatrix} -1 & 62 & 37 & -1 & 88 & -1 & -1 & 40 & -1 & 79 & 62 & -1 & -1 & 19 & -1 & 43 & 95 & 0 & -1 & -1 & -1 & -1 & -1 & -1 \\ -1 & 28 & -1 & -1 & 24 & -1 & -1 & 61 & -1 & 90 & 13 & -1 & -1 & 92 & -1 & 28 & -1 & 0 & 0 & -1 & -1 & -1 & -1 & -1 \\ -1 & -1 & -1 & 66 & 17 & 49 & -1 & 74 & -1 & 78 & -1 & -1 & -1 & 37 & -1 & 50 & -1 & -1 & 0 & 0 & -1 & -1 & -1 & -1 \\ -1 & -1 & -1 & -1 & 26 & 31 & -1 & 26 & -1 & 3 & -1 & -1 & 25 & 64 & -1 & 19 & -1 & -1 & -1 & 0 & 0 & -1 & -1 & -1 \\ 20 & -1 & -1 & 77 & -1 & 69 & 75 & -1 & 85 & -1 & -1 & 72 & 86 & -1 & 2 & -1 & -1 & -1 & -1 & -1 & 0 & 0 & -1 & -1 \\ 84 & -1 & 85 & -1 & -1 & -1 & 87 & -1 & 37 & -1 & -1 & 61 & 47 & -1 & 42 & -1 & 0 & -1 & -1 & -1 & -1 & 0 & 0 & -1 \\ 75 & 79 & 18 & -1 & -1 & -1 & 58 & -1 & 57 & -1 & 29 & 72 & -1 & -1 & 86 & -1 & -1 & -1 & -1 & -1 & -1 & -1 & 0 & 0 \\ 10 & 52 & 66 & 73 & -1 & -1 & 43 & -1 & 66 & -1 & 23 & 2 & -1 & -1 & 50 & -1 & 95 & -1 & -1 & -1 & -1 & -1 & -1 & 0 \end{bmatrix}$$

FIG. 26

$$\begin{array}{l}[1]\\ [2]\\ [3]\\ [4]\\ [5]\\ [6]\\ [7]\\ [8]\end{array} \begin{bmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\ -1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\ 10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\ -1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\ 23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\ -1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1 \\ 32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\ -1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0 \end{bmatrix}$$

FIG. 27

$$\begin{array}{l}[1]\\ [4]\\ [7]\\ [2]\\ [5]\\ [8]\\ [3]\\ [6]\end{array} \begin{bmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\ -1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\ 32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\ -1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\ 23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\ -1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0 \\ 10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\ -1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1 \end{bmatrix}$$

$$[1] \quad \begin{vmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \end{vmatrix}$$

METHOD AND APPARATUS OF ENCODING AND DECODING DATA USING LOW DENSITY PARITY CHECK CODE IN A WIRELESS COMMUNICATION SYSTEM

This application is a continuation of U.S. application Ser. No. 11/166,476, filed Jun. 23, 2005, now U.S. Pat. No. 7,581, 157, which, pursuant to 35 U.S.C. §119(a), claims the benefits of earlier filing date and right of priority to the following Korean Application Numbers, the contents of all of which are hereby incorporated by reference:
Korean Application No. P2004-47898, filed on Jun. 24, 2004;
Korean Application No. P2004-48454, filed on Jun. 25, 2004;
Korean Application No. P2004-85512, filed on Oct. 25, 2004;
Korean Application No. P2004-87361, filed on Oct. 29, 2004;
Korean Application No. P2004-87938, filed on Nov. 1, 2004;
Korean Application No. P2004-88807, filed on Nov. 3, 2004;
Korean Application No. P2004-109624, filed on Dec. 21, 2004;
Korean Application No. P2004-110678, filed on Dec. 22, 2004;
Korean Application No. P2004-111525, filed on Dec. 23, 2004;
Korean Application No. P2004-117136, filed on Dec. 30, 2004;
Korean Application No. P2005-00046, filed on Jan. 3, 2005;
Korean Application No. P2005-00244, filed on Jan. 3, 2005; and
Korean Application No. P2005-03296, filed on Jan. 13, 2005.

BACKGROUND OF THE INVENTION

1. Field of the Invention

The present invention relates to a method of encoding and decoding in a wireless communication system, and more particularly, to a method and apparatus of encoding and decoding data using low density parity check (LDPC) code in a wireless communication system. Although the present invention is suitable for a wide scope of applications, it is particularly suitable for simplifying complex operations and efficiently using the memory space.

2. Discussion of the Related Art

Generally, encoding signifies a process in which data is coded at a transmitting end to enable a receiving end to compensate for errors occurring from signal distortion and signal loss during data transmission through the air interface and recover the original data. Decoding is a process in which encoded data from the transmitting end is recovered to its original data at the receiving end.

A method of encoding using Low Density Parity Check (LDPC) code is known. The LDPC code is a type of error-correcting code invented by Robert Gallager in his PhD thesis in 1962. More specifically, the parity check matrix H, the elements of which are mostly comprised of '0's, is a low density linear block code. The LDPC codes were largely forgotten when first introduced due to the high complexity computations, but were reinvented in 1995 and proven effective. Research of the LDPC codes is under way (Reference: Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999)).

The parity check matrix of the LPDC code has very few 1's in each row and column. As a result, even in a large block, decoding is possible through a repetitive decoding procedure and, if the size of the block becomes very large, the LPDC code nearly satisfies Shannon's channel capacity limit as in turbo coding.

The LPDC code can be defined by a (n−k)×n parity check matrix H, wherein 'n' denotes the size of codeword after encoding process and 'k' denotes the size of data bits before encoding process. The generator matrix G can be derived from the following equation.

$$H \times G = 0 \quad \text{[Equation 1]}$$

With respect to encoding and decoding using the LDPC code, the transmitting end uses the parity check matrix H and the generator matrix G to encode data according to Equation 2.

$$c = G \times u \quad \text{[Equation 2]}$$

In Equation 2, the symbol 'c' refers to codeword and 'u' refers to data frame.

Recently, a method of encoding data using only the parity check matrix H and not the generator matrix G is being used. With respect to the encoding method using the LDPC code, the parity check matrix H can be considered to be the most important factor. Because the size of the parity check matrix H is approximately 1000×2000 or larger in practical communication system, the process of encoding and decoding requires many calculations, complex expressions, and large storage space.

After the parity check matrix H is generated, the input source data is encoded using the generated parity check matrix H.

SUMMARY OF THE INVENTION

Accordingly, the present invention is directed to a method and apparatus of encoding and decoding data using low density parity check in a wireless communication system that substantially obviates one or more problems due to limitations and disadvantages of the related art.

An object of the present invention is to provide a method for encoding data using LDPC code.

Another object of the present invention is to provide an apparatus for encoding data using LDPC code.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein. A method of encoding or decoding data using low density parity check (LDPC) code, the method comprising using a parity matrix comprising a plurality of z-by-z zero sub matrices and a plurality of z-by-z permutation sub matrices.

Wherein a plurality of z×z permutation sub-matrices of which row weights and column weights are '0' or '1.

In one aspect of the present invention, a method of encoding data using low density parity check (LDPC) code is provided, the method comprising providing a permutation matrix, a zero matrix and a base matrix generating a parity matrix by expanding the base matrix using the permutation matrix, zero matrix; and using the parity matrix to encode data to be transmitted.

In another aspect of the present invention, a method of encoding input source data using low density parity check (LDPC) code is defined by a base matrix having each element possesses permutation information for identifying a permutation matrix formed by shifting each row of the base permutation matrix a certain number of row intervals in the same direction. In this method, each element of the base matrix is a 96×96 permutation matrix and the base matrix is $$\begin{bmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\ -1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\ 10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\ -1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\ 23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\ -1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1 \\ 32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\ -1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0 \end{bmatrix}$$

Further, '0' denotes a 96×96 identity matrix, '−1' denotes a 96×96 zero matrix, an integer greater than or equal to 1 denotes a permutation matrix formed by shifting each row of the 96×96 identity matrix in the same direction, the same number of row intervals as the integer, 'X', which is between 0 and 95.

In another aspect of the present invention, an encoder is provided which includes a parity check matrix generation module for generating a parity check matrix by expanding a base matrix having each element possess permutation information for identifying a permutation matrix formed by permuting the base permutation matrix, and an encoding module for encoding input source data with the parity check matrix.

In another aspect of the present invention, a method of decoding data using low density parity check (LDPC) code is provided, the method comprising providing a permutation matrix, a zero matrix and a base matrix generating a parity matrix by expanding the base matrix using the permutation matrix, zero matrix; and using the parity matrix to decode data In another aspect of the present invention, a method of decoding input source data using low density parity check (LDPC) code is defined by a base matrix having each element possesses permutation information for identifying a permutation matrix formed by shifting each row of the base permutation matrix a certain number of row intervals in the same direction. The method includes the following base matrix of which each element is a 96×96 permutation matrix:

same number of row intervals as the integer, 'X', which is between 0 and 95.

In another aspect of the present invention, a decoder is provided which includes a parity check matrix generation module for generating a parity check matrix by expanding a base matrix having each element possess permutation information for identifying a permutation matrix formed by permuting the base permutation matrix, and a decoding module for encoding input source data with the parity check matrix.

In another aspect of the present invention, an apparatus for encoding data using low density parity check (LDPC) code is provided, the apparatus comprising a data source adapted to provide data to be transmitted, an LPDC encoder adapted to generate a parity matrix by expanding the base matrix using a permutation matrix and a zero matrix and encode the data to be transmitted using the parity matrix, a modulation module adapted to modulate the encoded data to generate modulated encoded data; and an antenna adapted to transmit the modulated encoded data.

In another aspect of the present invention, an apparatus for decoding data using low density parity check (LDPC) code is provided, the apparatus comprising an antenna adapted to receive modulated encoded data, a demodulation module adapted to demodulate the modulated encoded data to generate encoded data; and an LPDC decoder adapted to generate a parity matrix by expanding the base matrix using a permutation matrix and a zero matrix and decode the encoded data using the parity matrix.

It is to be understood that both the foregoing general description and the following detailed description of the present invention are exemplary and explanatory and are intended to provide further explanation of the invention as claimed.

$$\begin{bmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\ -1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\ 10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\ -1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\ 23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\ -1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1 \\ 32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\ -1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0 \end{bmatrix}$$

In this method, '0' denotes a 96×96 identity matrix, '−1' denotes a 96×96 zero matrix, an integer greater than or equal to 1 denotes a permutation matrix formed by shifting each row of the 96×96 identity matrix in the same direction and the

BRIEF DESCRIPTION OF THE DRAWINGS

The accompanying drawings, which are included to provide a further understanding of the invention and are incor porated in and constitute a part of this application, illustrate embodiment(s) of the invention and together with the description serve to explain the principle of the invention. In the drawings;

FIG. 2 illustrates a relationship of $H=[H_d|H_p]$.

FIG. 3 illustrates a structure of a dual diagonal matrix.

FIG. 4 illustrates $H^{(i)}_d$ having 16 sub-matrices, i.e., (1, 1), (1, 2), . . . , (4, 4) when m=4.

FIG. 5 illustrates a parity check matrix H when r=1/2.

FIG. 7 shows a parity check matrix H which includes a plurality of z×z permutation matrices or zero matrices.

FIG. 8 shows a base matrix $H_b$.

Figure 14A:
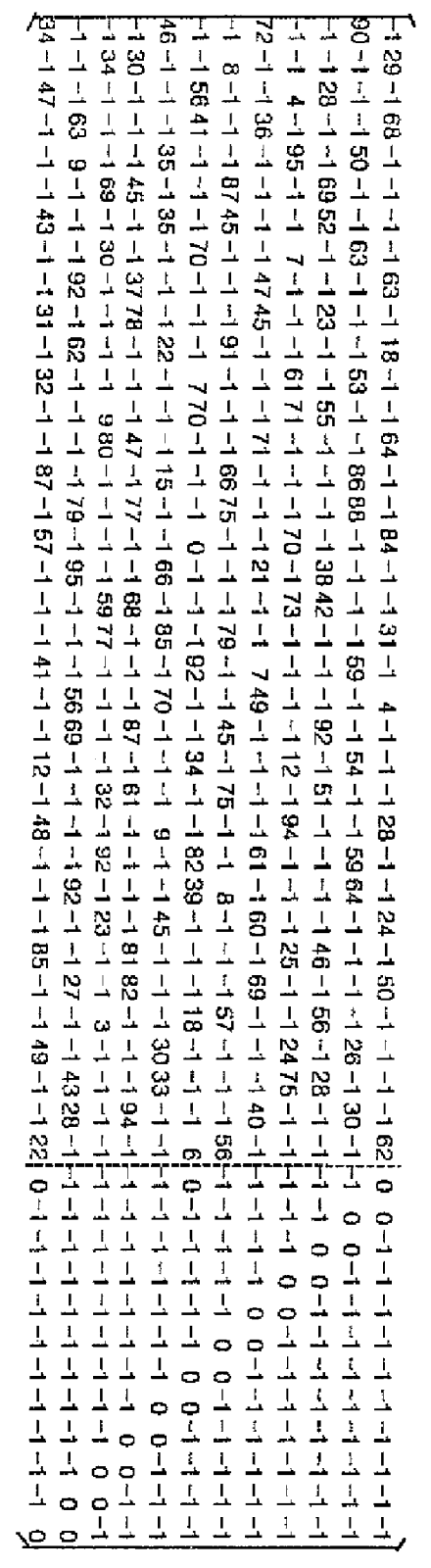
Figure 14B:
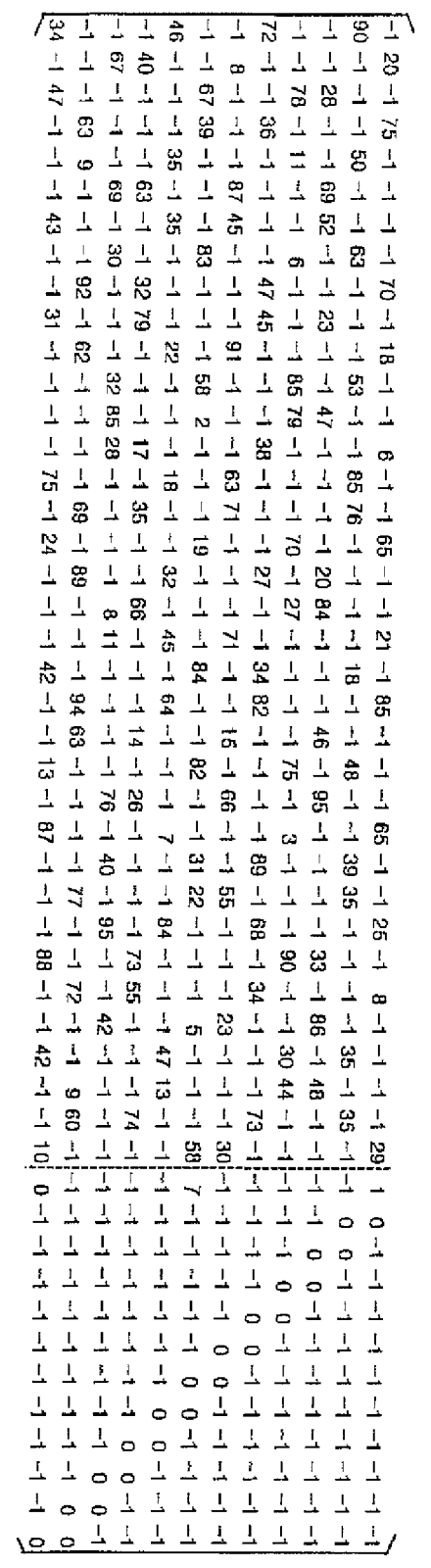
Figure 14C:
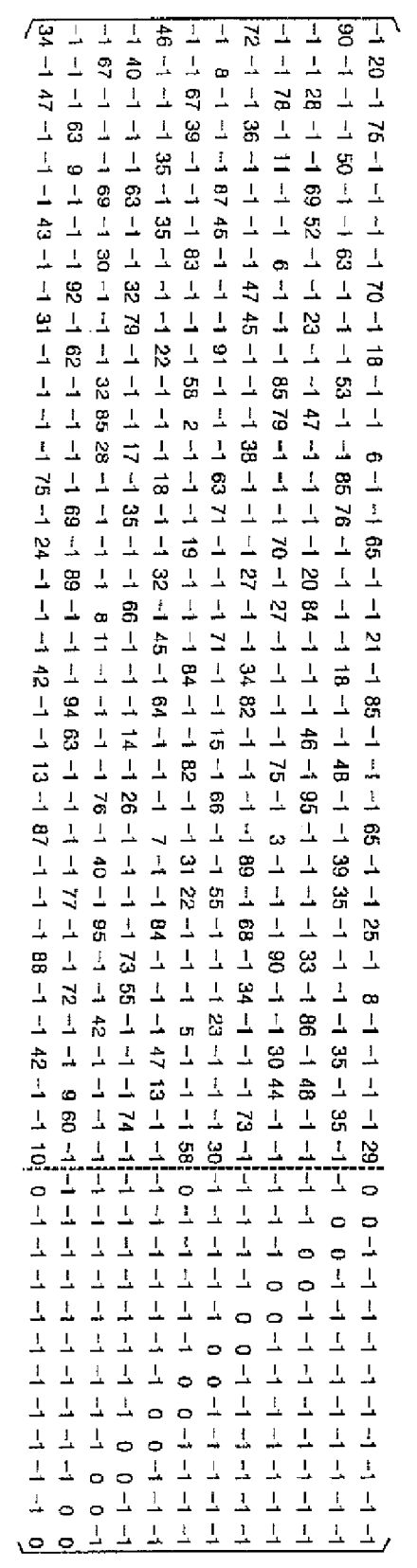
Figure 14D:
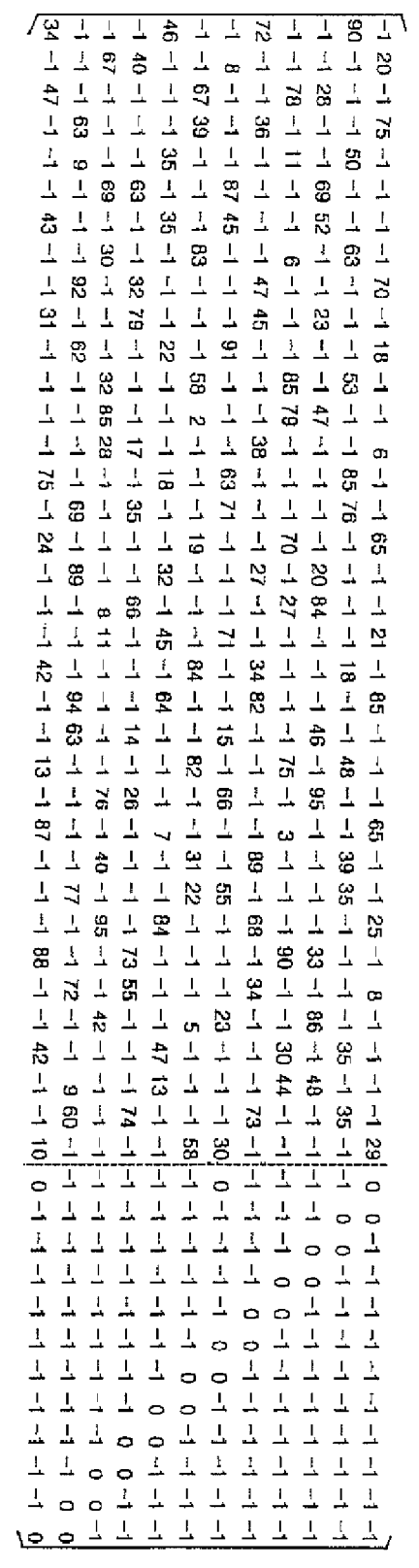
Figure 14E:
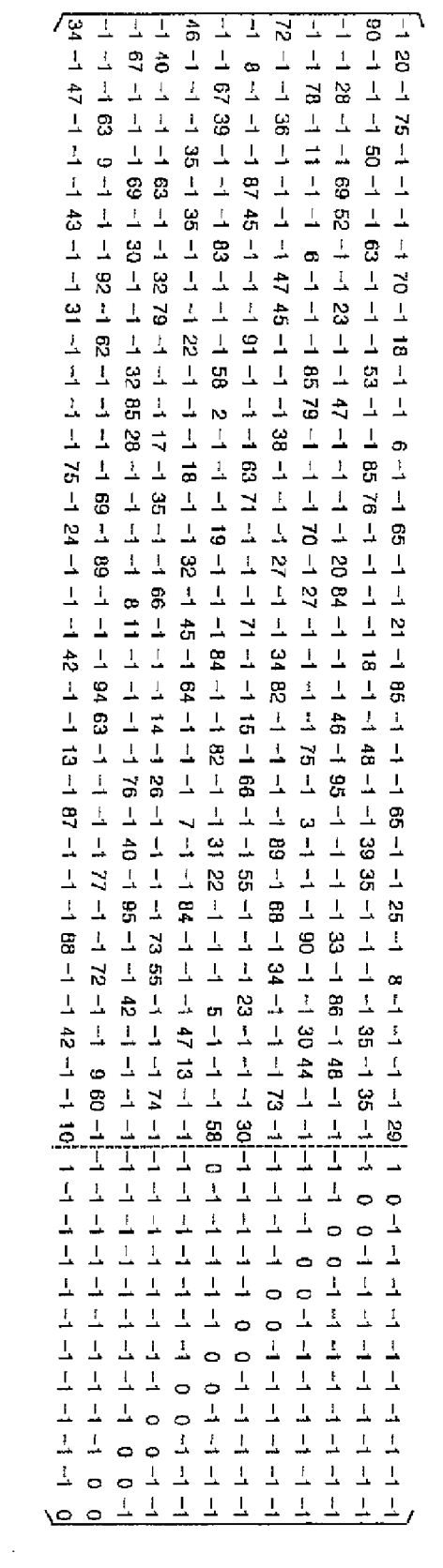
Figure 14F:
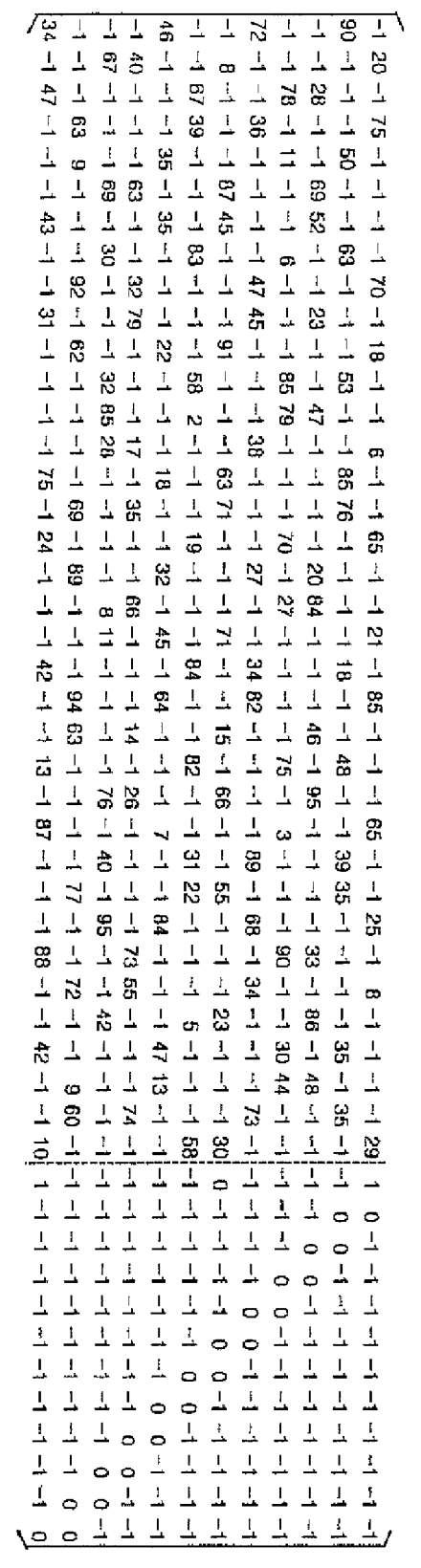

FIGS. 14a-14f illustrates preferred embodiments of the base matrix $H_b$ having functions.

FIG. 15 illustrates an embodiment of a base matrix $H_b$ when the code rate is ½.

FIG. 16 illustrates another embodiment of the base matrix $H_b$ when the code rate is ⅔.

FIG. 17 illustrates another embodiment of the base matrix when the code rate is ¾.

FIG. 18 illustrates another embodiment of the base matrix when the code rate is ½.

FIG. 19 illustrates another embodiment of the base matrix when the code rate is ½.

FIG. 20 illustrates another embodiment of the base matrix when the code rate is ½.

FIG. 21 illustrates another embodiment of the base matrix when the code rate is ⅔.

FIG. 22 illustrates another embodiment of the base matrix when the code rate is ¾.

FIG. 23 illustrates another embodiment of the base matrix when the code rate is ¾.

FIG. 24 illustrates another embodiment of the base matrix when the code rate is ⅔.

FIG. 25 illustrates another embodiment of the base matrix when the code rate is ⅔.

FIG. 26 illustrates another embodiment of the base matrix when the code rate is ⅔.

FIG. 27 illustrates another embodiment of the base matrix.

DETAILED DESCRIPTION OF PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
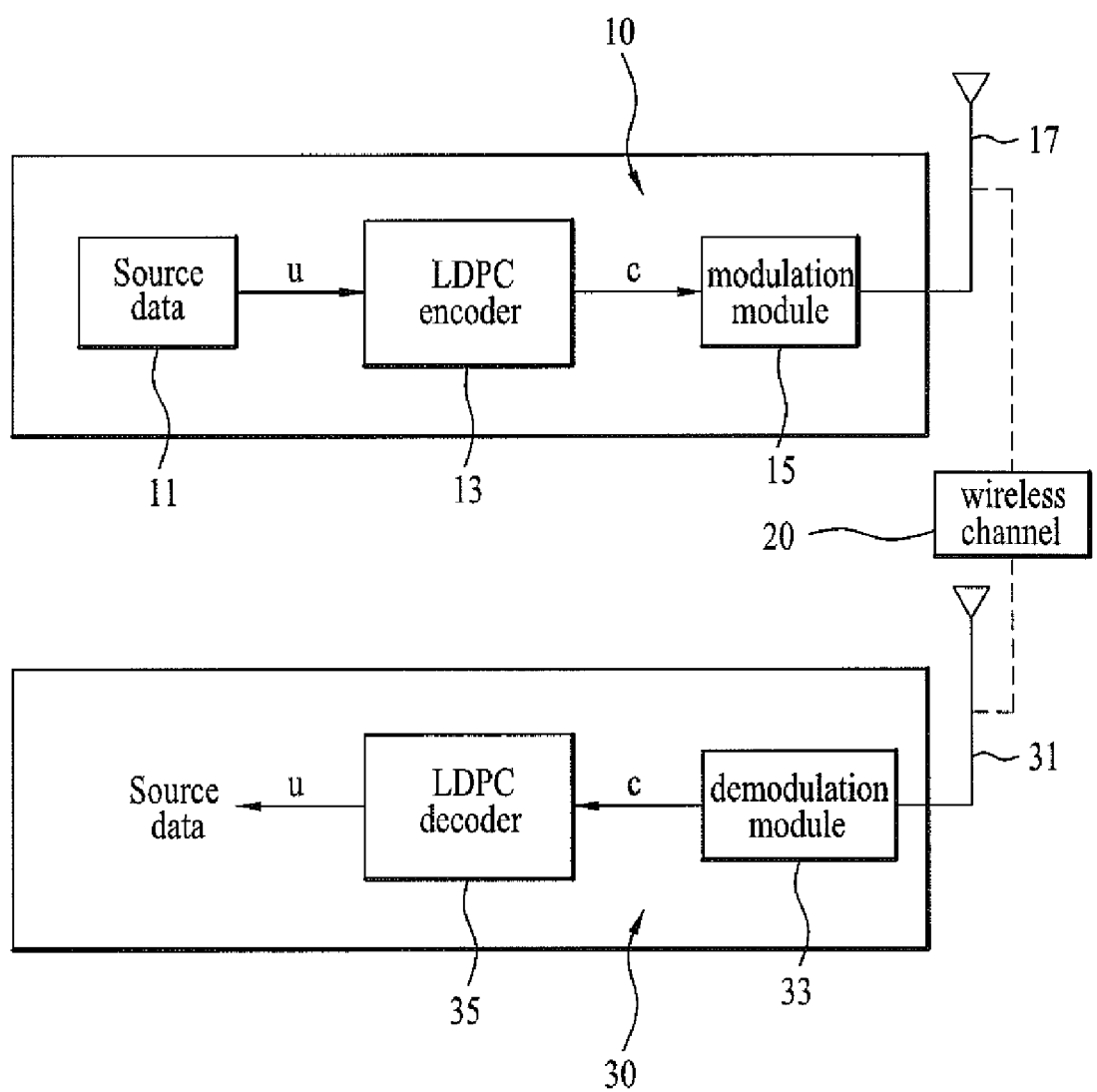
FIG. 1 is a schematic diagram of a wireless communication system.

FIG. 1 is a schematic diagram of a wireless communication system in which embodiments of the present invention may be implemented. In FIG. 1, a transmitter 10 and a receiver 30 communicate via a wireless channel 20. From a data source 11 in the transmitter 10, a source data 'u' of k bits is processed by an LDPC encoder 13 such that the source data is encoded and processed as codeword 'c' of n bits. The codeword 'c' is then transmitted by an antenna 17 after being modulated for wireless transmission by a modulation module 15. The signal transmitted via the wireless channel 20 is received by an antenna 31 in receiver 30. Thereafter, in receiver 30, an inverse operation is performed from that of the transmitter 10. For example, a demodulation module 33 demodulates the received signal before from forwarding codeword c of n bits to an LDPC decoder 35. The process of data transmission/reception is not limited to the above described example. The above described process is a simplified example to explain the embodiments of the present invention.

The embodiments of the present invention are directed to a specific operation of encoding and decoding using the LDPC code in the LDPC encoder 13 and the LDPC decoder 35. In addition, the embodiments are directed to a detailed description of an encoder and a decoder such as the LDPC encoder 13 and the LDPC decoder 35. The following are detailed examples of the embodiment.

Equation 3 shows calculation of code rate. In calculating the code rate, a transmitter takes into account factors, such as channel status and amount of transmission data.

$$r=k/n \qquad \text{[Equation 3]}$$

Here, 'k' represents the length of a source data, and n represents the length of an encoded data (or codeword).

The encoded data (or codeword) includes systematic bits and parity check bits. The systematic bits indicate pre-encoded source data, and the parity check bits indicate a series of bits which are decided by systematic bits and Generate Matrix and are added to the back portion of the systematic bits. The value 'n' in the equation indicates the number of bits added between the systematic bits and the parity check bits. The number of parity check bits is reduced to increase the code rate of the LDPC code, and the number of systematic bits is reduced in order to decrease the code rate of the LDPC code.

With respect to an encoding method using LDPC code, the input source data can be encoded using the generator matrix G based on Equation 1 and Equation 2. More specifically, the input source data $S_{1\times k}$ of the k bit is encoded through Equation 2 and becomes codeword $x_{1\times k}$ of the n bit. The codeword x includes x=[s p]=[$s_0, s_1, \ldots, s_{k-1}, p_0, p_1, \ldots, p_{m-1}$]. Here, ($p_0, p_1, \ldots, p_{m-1}$) represents parity check bits and ($s_0, s_1, \ldots, s_{k-1}$) represents systematic bits.

However, an encoding method using the generator matrix G is complex. In order to minimize such complexity, rather than relying on the generator matrix G, it is preferable to use a parity check matrix H to directly encode the input source data. Since x=[s p], using H·x=0, H·x=H·[s p]=0. From these relationships, the parity check bit p can be acquired and, consequently, codeword x=[s p] can be determined.

After the parity check matrix H is generated, the input source data is encoded using the generated parity check matrix H (S45).

Similar to the method used in the receiver 30 in FIG. 1, the following equation is used to decode the encoded data:

$$H \cdot x=0 \qquad \text{[Equation 4]}$$

Equation 4 describes how to detect decoding error. More specifically, if the decoded data x and the parity check matrix H are multiplied and the outcome is 0, the result signifies that there is no transmission error. However, if the outcome is a number other than 0, it signifies that there is transmission error.

Figure 11:
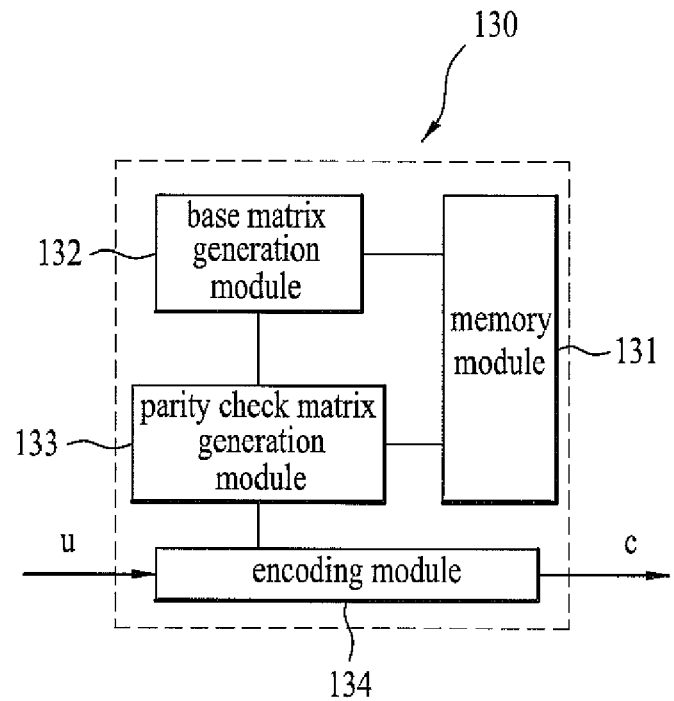
FIG. 11 is a structural diagram of a preferable embodiment of an encoding module using the LDPC code.
Figure 12:
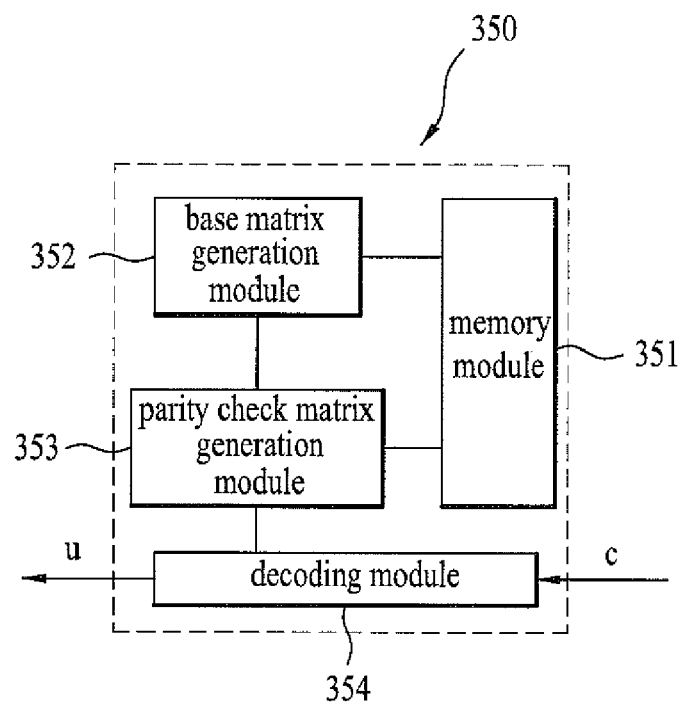
FIG. 12 is a structural diagram of a preferred embodiment of an encoding module.

FIGS. 11 and 12 are block diagrams of embodiments of an encoder 130 and a decoder 350, similar to, respectively, the LDPC encoder 13 and the LDPC decoder 35 of FIG. 1.

In Equation 1, the parity check matrix H can be expressed as $H=[H_d|H_p]$, where $H_d$ has a (n−k)×k dimension and $H_p$ has a (n−k)×(n−k) dimension. FIG. 2 is an example illustrating the relationship of $H=[H_d|H_p]$, where k represents the length of the source data (in bits) which is encoded in the LDPC encoder 13 and n represents the length of the encoded codeword c (in bits).

From the relationship between Equation 1 and $H=[H_d|H_p]$, the equation $G=[I|(H_p^{-1}H_d)^t]^t$ can be determined. Furthermore, the LDPC encoder 13 performs the encoding operation by multiplying $G=[I|(H_p^{-1}H_d)^t]^t$ by the input source data u, in accordance with Equation 2. Subsequently, Equation 2 can be expressed as the following Equation 5:

$$c=[I|(H_p^{-1}H_d)^t]^t \cdot u \quad \text{[Equation 5]}$$

In this equation, if Hp has dual diagonal form, then Hp−1 is easily calculated as lower triangular.

In addition to performing encoding operations by using the generator matrix G, it is also possible to perform encoding operations by directly encoding source data using the parity check matrix H.

Preferably, a (n−k)×(n−k) dual diagonal matrix can be used with $H_p$. Regardless of the dimension of the matrix, the dual diagonal matrix represents a matrix in which all elements of a main diagonal and a diagonal immediately above or below the main diagonal are '1's while the other elements are '0's. FIG. 3 illustrates the structure of an example of the dual diagonal matrix.

A code rate is considered an important parameter in a method of encoding and decoding using the LDPC code. Specifically, each code rate r should be supported by various codeword sizes, n. Usually, the values of 'r' are r=½, ⅔, or ¾, but the values of 'r' are not limited to these values. As for 'n,' n=24*z (here, z=24+4*i, where i=0, 1, 2, 3, 4, . . . , 18) is often used. Different base matrices can be used for each 'r' and 'n' to optimize encoding and decoding performances. However, if one base matrix $H_b$ is used for all 'n' with respect to a specific 'r,' the use of memory may be decreased. Therefore, it is important to determine how to modify the permutation information included in one base matrix $H_b$ to other n's.

The embodiment below provides for storing the first base matrix and the first base permutation matrix having a largest dimension ($z_{max}$) while using the first base matrix for encoding and decoding the base matrix of a second base permutation matrix having other dimensions (z).

An example of a method of storing the first base matrix of the first base permutation matrix having a largest dimension ($z_{max}$) and generating using the first base matrix for encoding and decoding the base matrix of a second base permutation matrix having other dimensions (z) will be described below.

FIG. 8 shows an example of a base matrix $H_b$. The base matrix shown in FIG. 8 is merely an example, and the actual size of the base matrix $H_b$ used in encoding and decoding is much larger. In FIG. 8, $z_{max}$ is 12. As such, the base matrix $H_b$ has a base permutation matrix having a 12×12 dimension, a plurality of permutation matrices which is formed by circular shifting each row of the base permutation matrix a specified interval in a certain direction, and a zero matrix. For example, '11' in the base matrix $H_b$ signifies the permutation matrix formed by circular shifting each row of the base permutation matrix 11 intervals (of rows or columns) in a specified direction.

Figure 9:
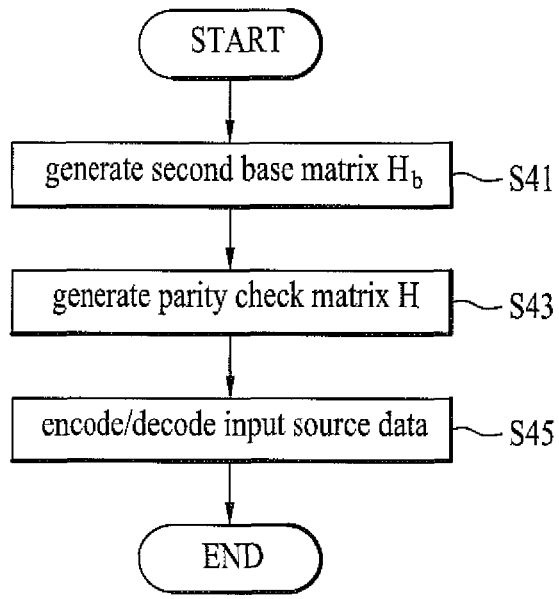
FIG. 9 illustrates another embodiment of encoding and decoding method using LDPC code.

FIG. 9 illustrates another embodiment of encoding and decoding method using LDPC code. The following example of FIG. 9 is based on the communication system of FIG. 1. In order to perform encoding operation, the LDPC encoder should include the first base permutation matrix having the largest dimension ($z_{max}$) and the first base matrix of the first base permutation matrix. The first base permutation matrix should preferably be an identity matrix. If a fixed matrix such as an identity matrix is used as the first permutation matrix, the LDPC encoder does not need to store the information of the first base permutation matrix.

It is possible for the transmitter 10 to transmit through a channel after the input source data has been encoded by using a generated H matrix by using the first base matrix. However, there are situations when an encoded input source data (codeword) is transmitted to the receiver 30 after the H matrix is generated by using the second base matrix of the second permutation matrix. The dimension size of the second permutation matrix is 'z' which is smaller in size than the largest dimension $z_{max}$.

When defining the base matrix $H_b$ according to $(H_b)_d$ and $(H_b)_p$, it is preferable to use a block dual diagonal matrix for $(H_b)_p$. More specifically, $(H_b)_d$ and $(H_b)_p$ is a part of the base matrix $H_b$ represented by $H=[(H_b)_d|(H_b)_p]$. The block dual diagonal matrix has a main diagonal and diagonals immediately above or below the main diagonal all forming an identity matrix while the rest being '0'. If $(H_b)_p$ is set to the block dual diagonal matrix, $H_p$ can have column weights of '1' and in order to avoid this, one or two zero matrix should be replaced with the identity matrix, preferably.

$(H_b)_d$ of the base matrix $H_b$ is formed by a combination of a base permutation matrix, a plurality of permutation matrices formed by circular shifting each row of the base permutation matrix a specified number of row intervals in a certain direction, and the zero matrix. It is preferable to consider the operation of encoding and decoding which provides the best performance when forming the base matrix $H_b$ by combining the above described permutation matrices.

In the H matrix, $H_d$ can be comprised of at least one $H^{(i)}_d$, where i=1, 2, . . . , r/(1−r), according to code rate (r=k/n). The code rate 'r' is determined by 'k' which is the length of source data and 'n' which is the length of encoded codeword 'c.' Generally, code rates such as r=½, ⅔, ¾, ⅘ can be used. $H^{(i)}_d$ is a matrix having (n−k)×(n−k) dimension, and is represented by $H_d=[H^{(1)}_d|H^{(2)}_d| \ldots |H^{(r/1−r))}_d]$.

Preferably, when each $H^{(i)}_d$ is divided into m×m sub-matrices having (n−k)/m×(n−k)/m dimensions, each row weight and column weight of the sub-matrix of the $H_d$ is '1'. More specifically, each row and column of the sub-matrix has an element of '1' while the other elements '0's. Furthermore, if any two rows of the $H_d$ are compared, these rows do not have more than one column having '1' overlapping each other. In $H_d$, no two rows has overlapping columns of '1', when two rows have a column overlapping in $H_p$. More specifically, if any two rows in $H_d$ are compared, for example, a row can have '1' at column 7 while the other row may also have '1' at column 7. However, these two rows do not have any other columns sharing '1's. If this condition is satisfied, the same concept applies to columns. In other words, no two columns has more than one overlapping rows of '1's.

FIG. 4 illustrates an example $H^{(i)}_d$ having 16 sub-matrices, i.e., (1, 1), (1, 2), . . . , (4, 4) when m=4. Having '1' as the row weight and column weights of each sub-matrix means that there is only one row or column having '1' in each sub-matrix while the rest of rows and columns having '0'. It is preferable for m to use '4'-'12', which ever provides the best performance.

In another example, the row weight or column weight of a sub-matrix of $H_d$ can be either '0' or '1'. In other words, among the sub-matrices of $H^{(i)}_d$, there are sub-matrices having '0' or '1' for row weight and column weight. As such, it is preferable for $H^{(i)}_d$ to have same number of sub-matrices having row and column weights of '0' in the row and column direction of $H^{(i)}_d$.

FIG. 5 illustrates an example of a parity check matrix H when r=½, with $H_d$ on the left side and a dual diagonal matrix $H_p$ on the right side. In FIG. 5, $H_d$ is comprised of a 25 sub-matrices. Here, a box labeled '1' represents a sub-matrix having row and column weights of '1' while a box labeled '0' represents a sub-matrix having row and column weights of '0'. In FIG. 5, a sub-matrix having row and column weights of '0' exists once per each row and column in $H_d$.

Figure 6:
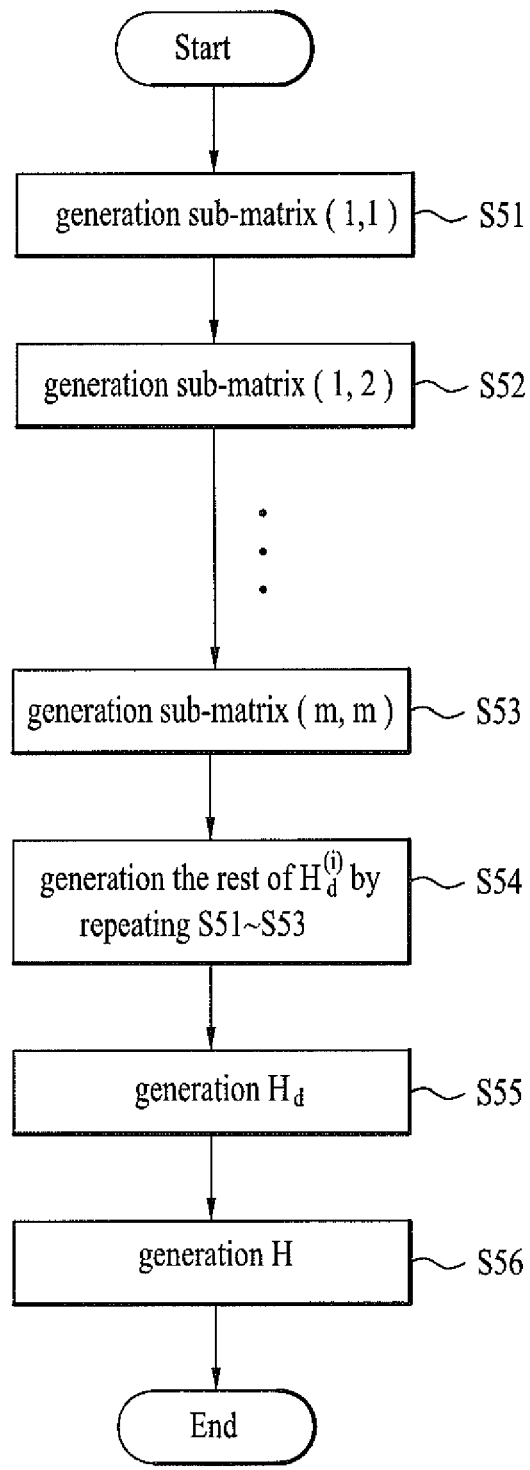
FIG. 6 is a flowchart illustrating generating a parity check matrix H.

FIG. 6 is a flowchart illustrating a process of generating a parity check matrix H. The examples describing the processes of generating a parity check matrix H is not limited to the example described below.

In the first process, all rows and column weights should be '0' or '1' with respect to sub-matrix (1, 1) of $H^{(i)}_d$(S51). A sub-matrix, such as the sub-matrix (1, 1) of $H^{(i)}_d$, from which other sub-matrices are generated is referred to as a base permutation matrix. Furthermore, it is preferable for the base permutation matrix to use identity matrix.

Next, the process involves performing permutation operation to the rows and columns of the base permutation matrix to sequentially generate each sub-matrix of $H^{(i)}_d$(S51-S53). Preferably, no two rows of $H_d$ should have more than one column with overlapping '1' in generating each sub-matrix of $H^{(i)}_d$. The sub-matrix formed by permutation operation of rows and columns of the base permutation matrix is referred to as a permutation matrix.

Furthermore, the rest of the $H^{(i)}_d$ are generated (S54) according to the first (S51) and second (S52) processes (S53). Also, all of the $H^{(i)}_d$ are combined to generate $H_d$ (S55). Finally, $H_d$ and $H_p$ are combined to generate H (S56).

FIG. 7 shows a parity check matrix H which includes a plurality of z×z permutation matrices or a zero matrices. In FIG. 7, $P_{ij}$ represents a z×z permutation matrix or a zero matrix.

When defining the base matrix $H_b$ according to $(H_b)_d$ and $(H_b)_p$, it is preferable to use a block dual diagonal matrix for $(H_b)_p$. More specifically, $(H_b)_d$ and $(H_b)_p$ is a part of the base matrix $H_b$ represented by $H=[(H_b)_d|(H_b)_p]$. The block dual diagonal matrix has a main diagonal and diagonals immediately above or below the main diagonal all forming an identity matrix while the rest being '0'. If $(H_b)_p$ is set to the block dual diagonal matrix, $H_p$ can have column weights of '1' and in order to avoid this, one or two zero matrix should be replaced with the identity matrix, preferably.

$(H_b)_d$ of the base matrix $H_b$ is formed by a combination of a base permutation matrix, a plurality of permutation matrices formed by circular shifting each row of the base permutation matrix a specified number of row intervals in a certain direction, and the zero matrix. It is preferable to consider the operation of encoding and decoding which provides the best performance when forming the base matrix $H_b$ by combining the above described permutation matrices.

With respect to the base matrix $H_b$, a difference in number of any two permutation information from the permutation information has to be below a selected first critical value. In other words, the number of each permutation matrix should be same or similar with respect to the base matrix $H_b$. Preferably, the value of the first critical value should be small but the value can be between 3-7

With respect to the parity check matrix H, it is preferable to prevent or minimize the occurrence of a 4-cycle or a 6-cycle. In particular, it is preferable for the parity check matrix H not to have the 4-cycle. Furthermore, it is preferable for the parity check matrix H to have 6-cycles less than a selected second critical value. When any two rows of the parity check matrix H has '1' at the same two columns, this is called the 4-cycle. Similarly, the 6-cycle is when any three rows of the parity check matrix have '1' at the same two columns based on any combinations of two rows.

In addition, with respect to $H_d$ in the parity check matrix H, the row weight and the column weight should have regularity which refers to same weight in all rows and in all columns respectively, because of low complex implementation without performance degradation. If a z×z identity matrix is used as the base permutation matrix, the parity check matrix H can have regularity in the row weight and the column weight.

The base matrix $H_b$ should be formed to achieve effective encoding and decoding performance for all code rates and codeword sizes. Because variable code rates and codeword sizes are being applied to mobile communication systems, the base matrix should be formed to achieve optimum performance for all code rate and codeword sizes when the base matrix $H_b$ is formed based on the combination of the base permutation matrix, the plurality of permutation matrices, and the zero matrices.

Each element of the first base matrix can have two or more permutation information. More specifically, the entire range of dimensions of the changing base permutation matrix can be divided into two or more smaller ranges in order that each range carries the optimum permutation information. For example, if the range of the changing dimension z is 10-96, the range is divided into two smaller ranges of dimensions. The first range includes 10-53 and the second range includes 54-96. Subsequently, the optimized first base matrix is assigned to each dimension. Although there are now two first base matrices, each first base matrix needs not to be independently stored and the elements of the first base matrix can store information of two first base matrices. As a result, performance of encoding and decoding is enhanced while requiring less memory.

An element of the parity check matrix H can be expressed by a base matrix $H_b$ which includes the permutation information used to identify a plurality of permutation matrices formed by permutation of row and columns of the base permutation matrix.

With respect to encoding and decoding using parity check matrix H in the LDPC encoder 13 or the LDPC decoder 35 in FIG. 1, the parity check matrix H can be generated after expanding the base matrix $H_b$ by using the base permutation matrix and the permutation information. Moreover, it is preferable to use the generated parity check matrix to perform encoding and decoding operation.

By expanding the base matrix $H_b$, it means that z×z matrix, which signifies the permutation information, replaces each element of the base matrix $H_b$. The z×z matrix refers to permutation matrix, or zero matrix. Here, based on the expansion of the base matrix $H_b$, the parity check matrix H is subsequently generated.

It is also possible to consider a different process for generating the H matrix from the base matrix $H_b$. First, '−1' is designated to 'zero matrix' and all other permutation information other than those of "−1" are designated to a binary base matrix $H_{bin}$, which has the same matrix dimension as $H_b$ having "1" designation. Furthermore, if $H_{bin}$ is used to generate the H matrix, the process of $H_{bin}$ generating $H_b$ is added. The process of generating the H matrix is same as above after $H_b$ is acquired.

As explained above, a plurality of permutation matrices are permuted and formed based on a specific method from at least one base permutation matrix. Preferably, a base permutation matrix is an identity matrix. Moreover, it is preferable for at least one base permutation matrix and the plurality of permutation matrices to have row and column weight of '1'. In other words, it is preferable to have only one element having '1' while the other elements are '0' from the elements of all rows and columns of the plurality of permutation matrices.

A method of circular shifting each entire row or column of the base permutation matrix a specified interval in a specific direction can be considered as the method for forming the plurality of permutation matrices from the base permutation matrix.

The parity check matrix H can be defined by a base matrix $H_b$ having permutation information as an element for identifying a base permutation matrix or a permutation matrix formed by permutation of each row or column of the base permutation matrix. The example provided below illustrates a case where each row or column of the base permutation matrix is shifted circularly a specified interval in a specified direction, for example, right or left, to form a plurality of permutation matrix from the base permutation matrix.

The first base matrix $H_b$ for the base permutation matrix having the largest dimension ($z_{max}$) is stored, and other base matrices for other base permutation matrices having smaller dimensions (z) are generated from the first base matrix by replacing each permutation information of the first base matrix with a remainder of each permutation information of the first base matrix divided by the value of 'z'.

Depending on the size of codewords, it may be necessary to make dimensions of the base permutation matrix 5×5 during encoding and decoding operation. In such a case, a modulo function 'mod(A, B)' can be used. Here, mod(A, B) indicates a remainder of A divided by B. In other words, with respect to the 5×5 base permutation matrix, '11' in the base matrix $H_b$ does not mean that each row of the base permutation matrix having a dimension size of 5×5 is shifted 11 intervals. Instead, it means that the rows are shifted 'mod(11, 5)=1' in the same direction.

The following example illustrates how to more efficiently generate the parity check matrix H and performing LDPC encoding and decoding operation based on the generated parity check matrix H when the dimensions (or value of 'z') of the base permutation matrix changes due to varying lengths of the codeword. The examples provided relate to generating a second base matrix based on different dimensions (z) of the base permutation matrix by using a first base matrix. Moreover, the second base matrix is generated by a similar shift pattern to that of the first base matrix, and consequently is able to enhance encoding and decoding performance.

In FIG. 9, the first base matrix is used by the transmitter 10 to generate the second base matrix (S41). The generation method of the second base matrix is explained by using the base matrix illustrated in FIG. 8. In FIG. 8, the size of the largest dimension $z_{max}$ is 12. Accordingly, the first base matrix $H_b$ is formed by indexing information. The indexing information comprises a 12×12 first base permutation matrix, a plurality of permutations formed by shifting circularly each row of the base permutation matrix a certain number of row intervals in a specified direction, and a zero matrix. For example, '11' in the base permutation matrix $H_b$ signifies the permutation matrix formed by shifting circularly the base permutation matrix 11 intervals (of rows or columns) in a specified direction.

Figure 10A:
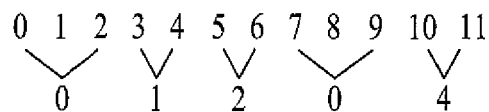
FIG. 10a illustrates an example for generating a second base matrix of a 5×5 second base permutation matrix from a first base matrix of a 12×12 first base permutation matrix.

FIG. 10a illustrates a method for generating a second base matrix of a 5×5 second base permutation matrix from a first base matrix of a 12×12 first base permutation matrix. If the dimension size (z) of the second base permutation is made smaller according to the size of codeword during the encoding operation in the transmitter, as depicted in FIG. 10a, a grouping method is used. In other words, '0,' '1,' and '2' of the first base matrix are grouped and mapped as '0' in the second base matrix. Similarly, '3' and '4' of the first base matrix are grouped and mapped as '1' while '5' and '6' are grouped and mapped as '2.' The same pattern of grouping and mapping is repeated such that '7,' '8,' and '9' are grouped and mapped as '3' and '10' and '11' are grouped and mapped as '4.' As a result of grouping and mapping, the second base matrix is generated.

In the grouping method, the permutation matrix of the first base permutation matrix having neighboring shift numbers is mapped to one permutation matrix of the second base permutation matrix. Furthermore, the grouping method is designed to maintain most of the base features of the first base matrix in generating the second base matrix. In FIG. 10a, at least two permutation matrix of the first base permutation matrix is grouped and mapped to one permutation matrix in the second base permutation matrix. However, it is possible to map one permutation matrix of the first base permutation matrix to one permutation matrix of the second base permutation matrix.

For a specific grouping method, a flooring function can be used as defined in Equation 6:

$$\text{Shift}(z) = \text{floor}(\text{shift}(z_{max})z/z_{max}) \quad [\text{Equation 6}]$$

In this equation, shift(z) denotes a number of shifted row intervals in the z×z permutation matrix. Also in the equation, floor(x) denotes a nearest integer from x approaching negative infinity.

Figure 10B:
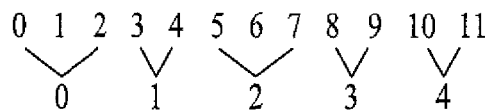
FIG. 10b illustrates a method for generating a second base matrix for a 5×5 second base permutation matrix from a first base matrix of a 12×12 first base permutation matrix according to Equation 5.

FIG. 10b illustrates a method for generating a second base matrix for a 5×5 second base permutation matrix from a first base matrix of a 12×12 first base permutation matrix according to Equation 5.

For example, a permutation matrix which has been generated by mapping a permutation matrix formed by shifting each row of the 12×12 first base permutation matrix 7 intervals to a 5×5 second base permutation matrix. This permutation can be expressed using Equation 6 as:

$$\text{Shift}(5) = \text{floor}(\text{shift}(12) \times 5 \div 12) = \text{floor}(7 \times 5 \div 12) = \text{Floor}(2.92) = 2$$

In other words, the permutation matrix, formed by shifting circularly each row of the 12×12 first base matrix 7 intervals, is mapped to a permutation matrix having each row of the 5×5 second permutation matrix shifted 2 intervals.

By using a generating method as explained above, the second base matrix can be generated by replacing each element of the first base matrix with elements of the second base matrix. It is possible to simplify the complexities by implementing the flooring function to hardware or software.

After the second base matrix is generated (S41), a parity check matrix H can be generated using the second base permutation matrix and the second base matrix (S43). The second base matrix can generate the parity check matrix H having a z×z dimension size by using the second base permutation matrix and the second base matrix. The second base matrix includes a zero matrix, identity matrix, or permutation matrix formed by shifting circularly all the rows of the second base permutation matrix a specified interval.

It is possible to perform the second base matrix generation procedure (S41) and the parity check matrix H generation procedure (S43) concurrently. It is also possible to generate the parity check matrix H by replacing each element of the second base matrix, which was acquired through Equation 6, with the corresponding elements of the zero matrix, base permutation matrix, or permutation matrix.

As described above, it is preferable for the base permutation matrix to perform a generation operation, first by considering the use of memory in the memory module and storing only the first base matrix of the first base permutation matrix having the largest dimension ($z_{max}$) and second by using the first base matrix for encoding and decoding in the base matrix of the second base permutation matrix having other dimension sizes (z). It is also preferable to set different dimension sizes of the base permutation matrix according to changes in the lengths of codewords.

Figure 13:
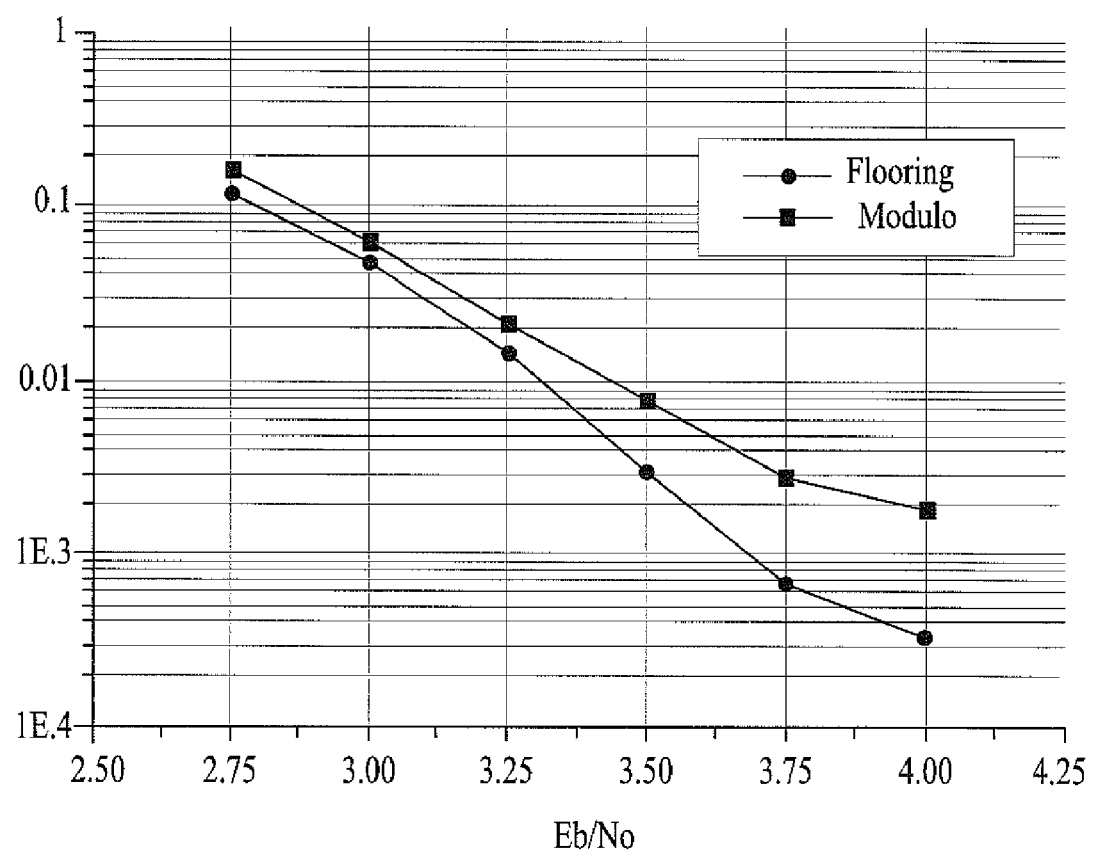
FIG. 13 illustrates a line graph depicting a simulation of a grouping method using a modulo method and a flooring method.

FIG. 13 illustrates a line graph depicting a simulation of a grouping method using a modulo function and a flooring function. Here, the graph indicates the superior performance of the flooring method compared to the modulo function.

FIG. 11 is a structural diagram of a preferable embodiment of an encoding module using the LDPC code. The encoder 130 includes a memory module 131, a base matrix generation module 132, a parity check matrix generation module 133, and an encoding module 134. The memory module 131 stores information related to the first base permutation matrix, the second base permutation matrix, and the first base matrix. The base matrix generation module 132 generates a second base matrix using the information of the first base permutation matrix and the first base matrix whose information is stored in the memory module 131. The parity check matrix generation module 133 generates a parity check matrix using the information of the second base permutation matrix, the second base matrix generated from the base matrix generation module 132 whose information is stored in the memory module 131. The encoding module 134 encodes the input source data using the parity check matrix generated from the parity check matrix module 133.

If the length of the codeword does not change, the memory module stores one base permutation matrix information and one base matrix information and the base matrix generation module is not necessary. Furthermore, if a simple matrix such as an identity matrix is used in the first or second permutation matrix, the memory module 131 does not have to store information of the first or second base permutation matrix. The functions of the base matrix generation module 132, the parity matrix generation module 133, and the encoding module 134 can be implemented in software or hardware based on the functions of each module.

FIG. 12 is a structural diagram of a preferred embodiment of a decoding module. The encoder 350 includes a memory module (351), a base matrix generation module (352), a parity check matrix generation module (353), and an encoding module (354). The function of the memory module 351, the base matrix generation module 352, and the parity check matrix generation module 353 are the same as the corresponding modules of FIG. 11. The encoding module 354 encodes the input data by using the parity check matrix generated by the parity check matrix generation module 353. The explanation provided with respect to the functions in FIG. 11 applies to FIG. 12.

The following is a detailed description of the base permutation matrix and the base matrix in order to effectuate better performance in encoding and decoding methods using the LDPC code.

FIGS. 14a-14f illustrates preferred embodiments of the base matrix $H_b$ having functions as described above. In FIGS. 14a-14f, a code rate is ¾. When the code rate is ¾, with respect to the base matrix, '0' signifies an identity matrix having a z×z dimension, '−1' signifies a zero matrix having a z×z dimension, and an integer greater than 1 signifies a permutation matrix formed by each row (or column) of the z×z identity matrix shifted circularly in a specified direction (i.e., right or left). The number of rows or columns shifted corresponds to the value of the integer. For example, if the integer is 5, then the rows (or columns) are shifted 5 intervals.

As illustrated in FIG. 15, if the code rate is ½, the size of the base matrix can be shortened from that of the base matrix for the ¾ code rate to form the base matrix $H_b$.

FIG. 16 is another embodiment of the base matrix $H_b$. The illustration of the base matrix is based on a code rate of ⅔. As described above with respect to FIGS. 14a-14f, the significance and effects of '0,' '−1,' and integer greater than or equal to 1 are the same.

FIG. 17 illustrates another embodiment of a base matrix for code rate ¾. In this embodiment, a number of 4-cycle and 6-cycle is minimized in the base matrix and the column weight is given regularity. Furthermore, in order for all code rates and codeword sizes to attain optimum performance, each element of the base matrix shifts the base permutation matrix. Comparing FIG. 17 to FIGS. 14a-14f, the performance of the matrix is comparable to that of the FIGS. 14a-14f despite having ¼ the size.

Figures 18, 19, 20:
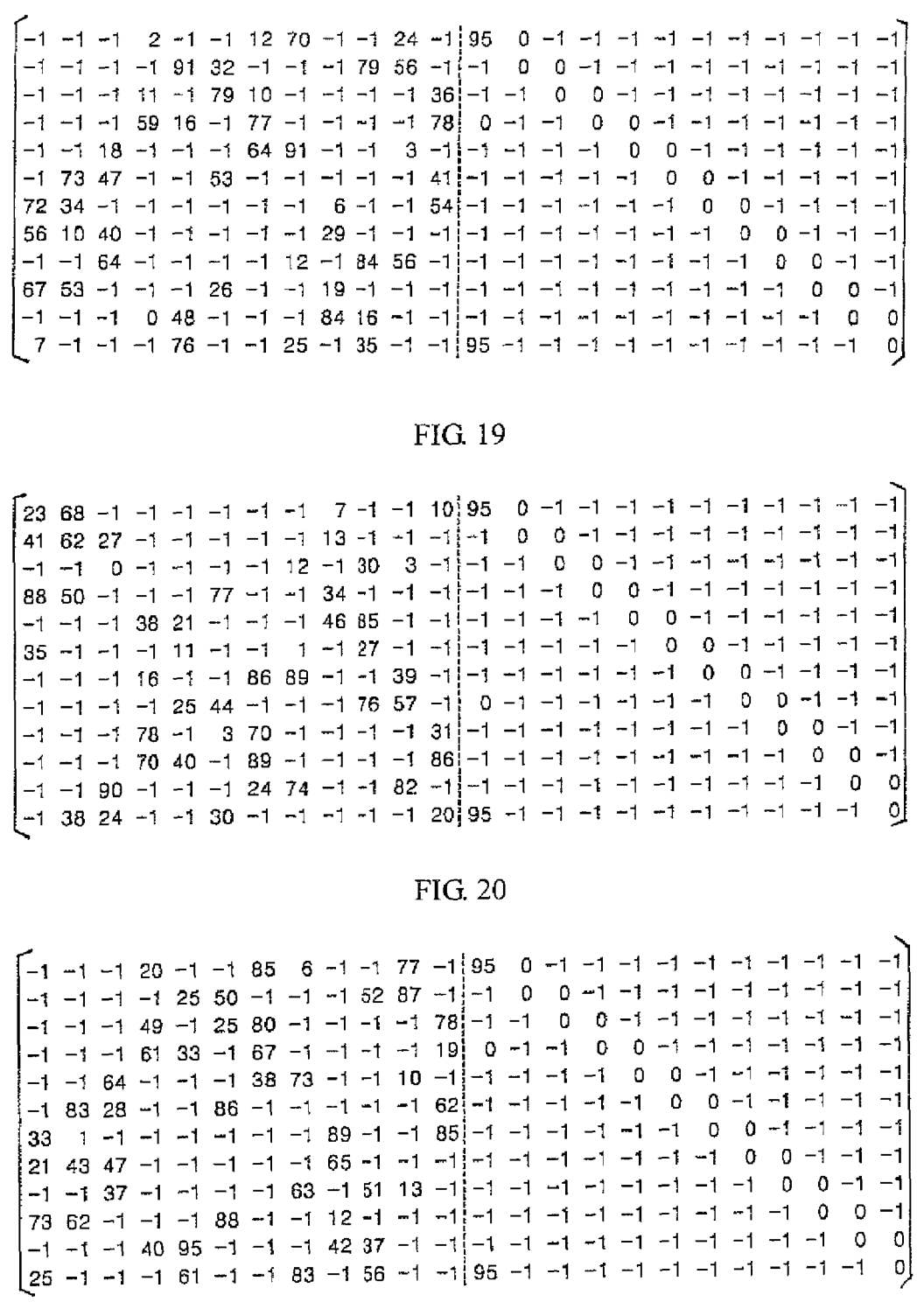

FIG. 18 illustrates another embodiment of a base matrix for code rate ½. In FIG. 18, the base matrix is designed to perform parallel processing more effectively. More specifically, when a sequential row order of (1→7→2→8→3→9→4→10→5→11→6→12) is set in the base matrix, the 'non-zero' elements of any two rows do not overlap and, at the same time, the elements do not overlap in any columns of the two rows. A 'non-zero' element refers to all other elements other than the elements of the zero matrix in the base matrix. For example, in FIG. 18, if row 8 is compared to either row 2 or row 3, the 'non-zero' element does not overlap in any columns of the compared rows.

FIG. 19 illustrates another embodiment of a base matrix for code rate ½. For a more effective parallel processing, the base matrix is designed so that 'non-zero' elements of two sets of rows, such as (1, 7), (2, 8), (3, 9), (4, 10), (5, 11), (6, 12), do not overlap with any columns of these rows. As shown by the embodiments of FIGS. 18 and 19, it is possible to implement an effective parallel processing during decoding.

FIGS. 20-22 illustrate other embodiments of a base matrix for code rates ½, ⅔, and ¾, respectively. In these figures, the base matrices provide effective performance after the base matrix is expanded to a z×z base permutation.

FIG. 23 illustrates another embodiment of a base matrix for code rate ¾. The base matrix is expanded by the base permutation matrix of all dimensions (z). Particularly, when z=56, performance is optimized.

FIGS. 24 and 25 illustrate other embodiments of a base matrix for code rate ⅔. The embodiments are designed to have irregular column weights for enhanced performance. In particular, FIG. 25 illustrates short codeword lengths such as c=576 or c=672.

FIG. 26 illustrates another embodiment of a base matrix for code rate ⅔. 'X' denotes an integer from 0 to 95 and, preferably, X may be 86, 89, or 95. The most preferable value is X=95. The base matrix in FIG. 26 has a parallel processing feature and is designed for effective performance. The parallel processing feature can significantly decoding operation time and more specifically, when each row is indexed in the order of 1, 2, 3, 4, 5, 6, 7, and 8, the 'non-zero' elements are non-overlapping between the rows of the generated matrix, which is generated from exchanging rows with neighboring rows. The 'non-zero' element refers to a shift number from 0-95, excluding −1. Furthermore, the neighboring cells indicate a non-overlapping 'non-zero' element between the first and last rows in the matrix generated by exchanging rows. An example of the base matrix in FIG. 26 that satisfies the above conditions is 1-4-7-2-5-8-3-6-(1) as illustrated in FIG. 27.

In FIG. 27, all the base matrix generated by exchanging rows in the base matrix have the same LDPC code as the LDPC code defined by the base matrix of FIG. 26. Moreover, with respect to encoding and decoding, even using the base matrix after the rows have been exchanged, the performance of the encoding and decoding operation can be the same as that of the base matrix of FIG. 26.

In the context of performance, a good performance is synonymous with a low Frame Error Rate (FER).

In the following description, a method of transmitting and receiving data which is encoded by LDPC code is introduced. More specifically, the base permutation matrix and the permutation information included in the base matrix is used to expand the base matrix. After the parity check matrix H is generated, the parity check matrix H is used to encode or decode the input source data. The examples provided hereinafter with respect to the method of encoding and decoding can be referenced to the IEEE 802.16e specification and relate to encoding and decoding used in transmitting data between a mobile subscriber station (MSS) and a base station (BS) in a Broadband Wireless Access System.

When the MSS enters a cell, the MSS transmits and receives the SBC-REQ and SBC-RSP messages with the BS in order to negotiate the capabilities of the MSS and the BS. Table 1 and Table 2 show the format of the SBC-REQ and SBC-RSP messages, respectively.

TABLE 1

| Syntax | Size | Notes |
|---|---|---|
| SBC-REQ_Message_Fromat( ){ | | |
| Management Message Type = 26 | 8 bits | |
| TLV Encoded Information | variable | TLV specific |
| } | | |

TABLE 2

| Syntax | Size | Notes |
|---|---|---|
| SBC-RSP_Message_Fromat( ){ | | |
| Management Message Type = 27 | 8 bits | |
| TLV Encoded Information | variable | TLV specific |
| } | | |

The functions of the MSS and the BS include the TLV message. A channel coding scheme supported by the MSS and the BS is included in the TLV field.

Table 3 and Table 4 show the formats of the TLV fields. Specifically, Tables 3 and 4 indicate demodulator options for downlink data reception and modulator options for uplink data transmission which can be found in the IEEE 802.16e specification. In Tables 3 and 4, a bit value of '0' indicates that the corresponding demodulating scheme is not supported and a bit value of '1' indicates that the corresponding modulating scheme is supported.

TABLE 3

| Type | Length | Value | Scope |
|---|---|---|---|
| 151 | 1 bit | Bit #0: 64-QAM<br>Bit #1: BTC<br>Bit #2: CTC<br>Bit #3: STC<br>Bit #4: AAS Diversity Map Scan<br>Bit #5: AAS Direct Signaling<br>Bit #6: H-ARQ<br>Bit #7: Reserved; shall be set to zero<br>Bits# 8: LDPC<br>Bits#9-15: Reserved; shall be set to zero | SBC-REQ<br>SBC-RSP |

TABLE 4

| Type | Length | Value | Scope |
|---|---|---|---|
| 152 | 1 | Bit# 0: 64-QAM<br>Bit# 1: BTC<br>Bit# 2: CTC<br>Bit# 3: AAS Diversity Map Scan<br>Bit# 4: AAS Direct Signaling<br>Bit# 5: H-ARQ<br>Bits# 6: LDPC<br>Bits# 7: Reserved; shall be set to zero | SBC-REQ<br>SBC-RSP |
| 153 | 1 | The number of HARQ ACK Channel | SBC-REQ<br>SBC-RSP |

Although lower code rate generally means higher coding gain, the amount of data that can be transmitted in a given broadband decreases. Furthermore, the transmission rate is determined on the basis of the wireless channel status.

In a good wireless channel environment, more data can be transmitted in a given broadband by transmitting using a higher code rate. On the contrary, in a poor wireless channel environment poor, the transmission success rate increases by transmitting using a lower code rate. Channel information is transmitted from the data receiving end to the data transmitting end via a Channel Quality Indication Channel (CQICH). The transmitting end determines the modulation order by using methods such as Quadrature Phase Shift Keying (QPSK), 16 Quadrature Amplitude Modulation (QAM), and 64 QAM, and determines the code rate based on the CQICH information and the available wireless resources.

If the MSS transmits data to the BS after channel coding by an encoding procedure using the LDPC code, the MSS indicates that the data is LDPC channel encoded through the Uplink Channel Descriptor (UCD) burst profile encoding which is located before the data. The UCD includes code rate information. The BS uses the information received from the UCD to decode the data. Table 5 shows an example of an UCD burst profile encoding format.

TABLE 5

| Name | Type (1 byte) | Length | Value |
|---|---|---|---|
| FEC Code type | 150 | 1 | 0 = QPSK (CC) ½<br>1 = QPSK (CC) ¾<br>2 = 16-QAM (CC) ½<br>3 = 16-QAM (CC) ¾<br>4 = 64-QAM (CC) ⅔<br>5 = 64-QAM (CC) ¾<br>6 = QPSK (BTC) ½<br>7 = QPSK (BTC) ⅔<br>8 = 16-QAM (BTC) ⅗<br>9 = 16-QAM (BTC) ⅘<br>10 = 64-QAM (BTC) ⅝<br>11 = 64-QAM (BTC) ⅘ |

TABLE 5-continued

| Name | Type (1 byte) | Length | Value |
|---|---|---|---|
| | | | 12 = QPSK (CTC) ½ |
| | | | 13 = QPSK (CTC) ⅔ |
| | | | 14 = QPSK (CTC) ¾ |
| | | | 15 = 16-QAM (CTC) ½ |
| | | | 16 = 16-QAM (CTC) ¾ |
| | | | 17 = 64-QAM (CTC) ⅔ |
| | | | 18 = 64-QAM (CTC) ¾ |
| | | | 19 = 64-QAM (CTC) ⅚ |
| | | | 20 = QPSK (ZT CC) ½ |
| | | | 21 = QPSK (ZT CC) ¾ |
| | | | 22 = 16-QAM (ZT CC) ½ |
| | | | 23 = 16-QAM (ZT CC) ¾ |
| | | | 24 = 64-QAM (ZT CC) ⅔ |
| | | | 25 = 64-QAM (ZT CC) ¾ |
| | | | 26 = QPSK(LDPC) ½ |
| | | | 27 = QPSK (LDPC) ⅔ |
| | | | 28 = QPSK (LDPC) ¾ |
| | | | 29 = 16-QAM (LDPC) ½ |
| | | | 30 = 16-QAM (LDPC) ⅔ |
| | | | 31 = 16-QAM(LDPC) ¾ |
| | | | 32 = 64-QAM (LDPC) ½ |
| | | | 33 = 64-QAM (LDPC) ⅔ |
| | | | 34 = 64-QAM (LDPC) ¾ |
| | | | 35 = QPSK (LDPC) ⅔ |
| | | | 36 = QPSK (LDPC) ¾ |
| | | | 37 = 16-QAM (LDPC) ⅔ |
| | | | 38 = 16-QAM (LDPC) ¾ |
| | | | 39 = 64-QAM (LDPC) ⅔ |
| | | | 40 = 64-QAM (LDPC) ¾ |
| | | | 41 . . . 255 = Reserved |
| Ranging data Ratio | 151 | 1 | Reducing factor in units of 1 dB, between the power used for this burst and power should be used for CDMA Ranging. |
| Normalized C/N Override | 152 | 5 | This is a list of numbers, where each number is encoded by one nibble, and interpreted as a signed integer. The nibbles correspond in order to the list define by Table 332, starting from the second line, such that the LS nibble of the first byte corresponds to the second line in the table. The number encoded by each nibble represents the difference in normalized C/N relative to the previous line in the table. |

If the BS transmits the LDPC channel coded data to the MSS, the BS indicates to the MSS that the data is LDPC channel encoded through a Downlink Channel Descriptor (DCD) burst profile encoding which is located before the data. The DCD includes code rate and code rate information. The BS uses the information received from the DCD to decode the data. Table 6 shows an example of a DCD burst profile encoding format.

TABLE 6

| Name | Type | Length | Value |
|---|---|---|---|
| FEC Code Type | 150 | 1 | 0 = BPSK (CC) ½ |
| | | | 1 = QPSK (RS + CC/CC) ½ |
| | | | 2 = QPSK (RS + CC/CC) ¾ |
| | | | 3 = 16-QAM (RS + CC/CC) ½ |
| | | | 4 = 16-QAM (RS + CC/CC) ¾ |
| | | | 5 = 64-QAM (RS + CC/CC) ⅔ |
| | | | 6 = 64-QAM (RS + CC/CC) ¾ |
| | | | 7 = QPSK (BTC) ½ |
| | | | 8 = QPSK (BTC) ¾ or ⅔ |
| | | | 9 = 16-QAM (BTC) ⅗ |
| | | | 10 = 16-QAM (BTC) ⅘ |
| | | | 11 = 64-QAM (BTC) ⅔ |
| | | | 12 = 64-QAM (BTC) ⅚ |
| | | | 13 = QPSK (CTC) ½ |

TABLE 6-continued

| Name | Type | Length | Value |
|---|---|---|---|
| | | | 14 = QPSK (CTC) ⅔ |
| | | | 15 = QPSK (CTC) ¾ |
| | | | 16 = 16-QAM (CTC) ½ |
| | | | 17 = 16-QAM (CTC) ¾ |
| | | | 18 = 64-QAM (CTC) ⅔ |
| | | | 19 = 64-QAM (CTC) ¾ |
| | | | 20 = QPSK (ZT CC) ½ |
| | | | 21 = QPSK (ZT CC) ¾ |
| | | | 22 = 16-QAM (ZT CC) ½ |
| | | | 23 = 16-QAM (ZT CC) ¾ |
| | | | 24 = 64-QAM (ZT CC) ⅔ |
| | | | 25 = 64-QAM (ZT CC) ¾ |
| | | | 26 = QPSK (LDPC) ½ |
| | | | 27 = QPSK (LDPC) ⅔ |
| | | | 28 = QPSK (LDPC) ¾ |
| | | | 29 = 16-QAM (LDPC) ½ |
| | | | 30 = 16-QAM (LDPC) ⅔ |
| | | | 31 = 16-QAM (LDPC) ¾ |
| | | | 32 = 64-QAM (LDPC) ½ |
| | | | 33 = 64-QAM (LDPC) ⅔ |
| | | | 34 = 64-QAM (LDPC) ¾ |
| | | | 35 = QPSK (LDPC) ⅔ |
| | | | 36 = QPSK (LDPC) ¾ |
| | | | 37 = 16-QAM (LDPC) ⅔ |
| | | | 38 = 16-QAM (LDPC) ¾ |
| | | | 39 = 64-QAM (LDPC) ⅔ |
| | | | 40 = 64-QAM (LDPC) ¾ |
| | | | 41 . . . 255 = Reserved |
| DIUC mandatory exit threshold | 151 | 1 | 0-63.75 dB CINR at or below where this DIUC can no longer be used and where this change to a more robust DIUC is required, in 0.25 dB units. See FIG. 81. |
| DIUC minimum entry threshold | 152 | 1 | 0-63.75 dB The minimum CINR required to start using this DIUC when changing from a more robust DIUC is required, in 0.25 dB units. See FIG. 81. |
| TCS_enable | 153 | 1 | 0 = TCS disabled 1 = TCS enabled 2-255 = Reserved |

The following is an explanation of a method of encoding a data using the LDPC code in the encoder of a transmitter. According to the IEEE 802.16e specification, data is received in the physical layer from an upper layer. Before encoding in the physical layer, the data goes through several processes including padding, data randomization, and packet concatenation processes. The padding process involves adding '1' to the rear portion of the data to satisfy the fixed size if the size of the data received from the upper layer does not meet the size of the fixed channel coding block. The data randomization process includes spreading the data in order to prevent a possible problem in clock recovery in the receiving end when unmodulated symbols occur during transmission if the input data has a fixed pattern. The packet concatenation process includes setting the size of the encoding block to fit the given broadband size. The encoding block determined through these processes is one of {36, 42, 48, 54, 56, 60, 63, 64, 66, 72, 78, 80, 81, 84, 88, 90, 96, 99, 102, 104, 108, 112, 114, 117, 120, 128, 132, 135, 136, 138, 144, 152, 153, 160, 162, 168, 171, 176, 180, 184, 189, 192, 198, 207, 216}. The input source data of the encoder in the transmitting end is determined after the above-mentioned processes.

The encoded data is transmitted to the receiving end through the physical channel. With respect to the IEEE 802.16e specification, the encoded data is mapped according to an Orthogonal Frequency Division Multiplexing symbol before transmission. Specifically, the modulation order of the mapped symbol is determined after considering the size of the given broadband and the status of the transmission channel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus for encoding data using low density parity check (LDPC) code, the apparatus comprising:
   a base matrix generation module to generate a second base matrix by replacing each first value corresponding to each element of a first base matrix with a second value corresponding to each element of the second base matrix, wherein each first value of the first base matrix is an integer that indicates either a zero matrix or a first permutation matrix having a $z_{max} \times z_{max}$ size and each second value of the second base matrix is an integer that indicates either a zero matrix or a second permutation matrix having a z×z size;
   a parity check matrix generation module to generate a parity check matrix by replacing each second value of the second base matrix with a corresponding second permutation matrix or the zero matrix having the z×z size; and
   an encoding module to encode data using the parity check matrix,
   wherein $z_{max}$ is greater than z and each second value is determined based on the equation shift(z)=floor (shift $(z_{max})z/z_{max}$), and
   wherein "shift $(z_{max})$" is the first value, "shift(z)" is the second value, and "floor (x)" denotes a nearest integer from x toward negative infinity.

2. The apparatus of claim 1, wherein the second value corresponding to each element of the second base matrix is either a non-negative integer or "−1," and the parity check matrix generation module comprises:
   means for replacing the second value of "−1" with the zero matrix having the z×z size;
   means for replacing the second value of the positive integer with a second permutation matrix having the z×z size, the second permutation matrix altered from an identity matrix having the z×z size according to the positive integer; and
   means for replacing the second value of a zero with a second permutation matrix that is the identity matrix having the z×z size.

3. The apparatus of claim 2, wherein the second permutation matrix indicated by the positive integer is altered by circular shifting either each entire row or each entire column of the identity matrix a number of intervals equal to the positive integer.

4. The apparatus of claim 1, wherein each of the first permutation matrix and second permutation matrix is defined as having a row weight and column weight of "1".

5. The apparatus of claim 1, wherein the number of rows of the second base matrix is equal to the number of columns in the parity check matrix divided by z and multiplied by (1−(a coding rate)).

6. The apparatus of claim 1, wherein the base matrix generation module determines each second value based on the following equation:
shift(z)=floor (shift $(z_{max})$ $z/z_{max}$), where "shift $(z_{max})$" is the first value, "shift(z)" is the second value, and "floor (x)" denotes a nearest integer from x toward negative infinity.

7. The apparatus of claim 1, wherein at least two continuous integers corresponding to the first value are grouped and mapped to one second value when determining each second value.

8. The apparatus of claim 1, wherein the base matrix generation module replaces a first value that indicates the zero matrix having the $z_{max} \times z_{max}$ size with a second value that indicates the zero matrix having the z×z size.

9. A method of generating a base matrix used for encoding or decoding data in a mobile communication system, the method comprising:
   providing a plurality of first base matrixes for a plurality of code rates, each of the first base matrixes including a first value as an element, the first value an integer that indicates either a zero matrix or a first permutation matrix having a $z_{max} \times z_{max}$ size;
   selecting one of the plurality of first base matrixes, the selected one of the plurality of first base matrixes corresponding to a first code rate among the plurality of code rates; and
   generating a second base matrix by replacing each first value corresponding to each element of the selected one of the plurality of first base matrixes with a second value corresponding to each element of the second base matrix, the second value an integer that indicates either a zero matrix or a second permutation matrix having a z×z size, wherein z is smaller than $z_{max}$ and each second value is determined based on the equation shift(z)=floor (shift $(z_{max})$ is the first value, "shift(z)" is the second value, and "floor (x)" denotes a nearest integer from x toward negative infinity.

10. The method of claim 9, wherein the plurality of code rates comprise ½, ⅔, or ¾.

11. The method of claim 9, wherein each of the first permutation matrix and second permutation matrix is defined as having a row weight and column weight of "1".

12. The method of claim 9, wherein the number of rows of the second base matrix is equal to the number of columns in the parity check matrix divided by z and multiplied by (1−(a coding rate)).

13. The method of claim 9, wherein at least two continuous integers corresponding to the first value are grouped and mapped to one second value when determining each second value.

14. The method of claim 9, wherein each second value is determined based on the following equation:
shift(z)=floor (shift $(z_{max})$ $z/z_{max}$), where "shift $(z_{max})$" is the first value, "shift(z)" is the second value, and "floor (x)" denotes a nearest integer from x toward negative infinity.

15. The method of claim 9, wherein generating the second base matrix further comprises replacing a first value that indicates the zero matrix having the $z_{max} \times z_{max}$ size with a second value that indicates the zero matrix having the z×z size.

* * * * *